(12) United States Patent
Ito et al.

(10) Patent No.: US 11,788,777 B2
(45) Date of Patent: Oct. 17, 2023

(54) TEMPERATURE CONTROL SYSTEM AND INTEGRATED TEMPERATURE CONTROL SYSTEM

(71) Applicants: CKD CORPORATION, Aichi (JP); EBARA CORPORATION, Tokyo (JP); EBARA REFRIGERATION EQUIPMENT & SYSTEMS CO., LTD., Tokyo (JP)

(72) Inventors: Akihiro Ito, Aichi (JP); Norio Kokubo, Aichi (JP); Masayuki Kouketsu, Aichi (JP); Isahiro Hasegawa, Aichi (JP); Toshiharu Nakazawa, Tokyo (JP); Keisuke Takanashi, Tokyo (JP); Yukihiro Fukusumi, Tokyo (JP)

(73) Assignees: CKD CORPORATION, Aichi (JP); EBARA CORPORATION, Tokyo (JP); EBARA REFRIGERATION EQUIPMENT & SYSTEMS CO., LTD., Tokyo (JP)

( * ) Notice: Subject to any disclaimer, the term of this patent is extended or adjusted under 35 U.S.C. 154(b) by 208 days.

(21) Appl. No.: 17/093,002

(22) Filed: Nov. 9, 2020

(65) Prior Publication Data
US 2021/0140688 A1 May 13, 2021

(30) Foreign Application Priority Data
Nov. 8, 2019 (JP) .................. 2019-203219

(51) Int. Cl.
*F25B 30/02* (2006.01)
*F25B 49/02* (2006.01)
*F25B 29/00* (2006.01)

(52) U.S. Cl.
CPC ............ *F25B 30/02* (2013.01); *F25B 29/003* (2013.01); *F25B 49/02* (2013.01)

(58) Field of Classification Search
CPC ......... F25B 30/02; F25B 29/003; F25B 49/02
See application file for complete search history.

(56) References Cited

U.S. PATENT DOCUMENTS 4,271,679 A * 6/1981 Schafer .................. F24D 11/02
  62/238.4
5,335,508 A * 8/1994 Tippmann ................ F25B 7/00
  62/305

(Continued)

FOREIGN PATENT DOCUMENTS

CN 106196474 A 12/2016
JP H09-298192 A 11/1997

(Continued)

OTHER PUBLICATIONS

Office Action issued in related U.S. Appl. No. 17/100,191 dated Sep. 30, 2022 (14 pages).

(Continued)

*Primary Examiner* — Henry T Crenshaw
(74) *Attorney, Agent, or Firm* — Osha Bergman Watanabe & Burton LLP

(57) ABSTRACT

A temperature control system is used for controlling a temperature of a control target. The system includes: a first circulation circuit through which a first heat transfer medium circulates; a second circulation circuit that is independent of the first circulation circuit and through which a second heat transfer medium circulates; and a third circulation circuit that is independent of the first circulation circuit and the second circulation circuit and through which a third heat transfer medium circulates. The third heat transfer medium has a usable temperature range wider than usable temperature ranges of the first heat transfer medium and the second heat transfer medium.

19 Claims, 11 Drawing Sheets

(56) References Cited

U.S. PATENT DOCUMENTS

| | | | |
|---|---|---|---|
| 6,063,710 | A | 5/2000 | Kadomura et al. |
| 6,148,626 | A | 11/2000 | Iwamoto |
| 6,174,408 | B1 | 1/2001 | Kadomura et al. |
| 7,988,062 | B2 | 8/2011 | Nonaka et al. |
| 10,580,577 | B2 | 3/2020 | Akiyoshi |
| 2005/0252222 | A1 | 11/2005 | Jessen et al. |
| 2009/0118872 | A1* | 5/2009 | Nonaka ............. G05D 23/1934 700/285 |
| 2010/0206519 | A1 | 8/2010 | Cho et al. |
| 2014/0262030 | A1 | 9/2014 | Buchberger, Jr. |
| 2018/0156474 | A1* | 6/2018 | Göransson ........... F25B 25/005 |
| 2018/0374639 | A1 | 12/2018 | Akiyoshi |
| 2020/0132344 | A1 | 4/2020 | Seki |
| 2021/0140719 | A1* | 5/2021 | Ito ......................... F28D 20/028 |
| 2021/0310688 | A1 | 10/2021 | Kato et al. |

FOREIGN PATENT DOCUMENTS

| | | | |
|---|---|---|---|
| JP | 2716248 | B2 | 2/1998 |
| JP | H11183005 | A | 7/1999 |
| JP | 2000339038 | A | 12/2000 |
| JP | 2001134324 | A | 5/2001 |
| JP | 2011-179757 | A | 9/2011 |
| JP | 4956672 | B2 | 6/2012 |
| JP | 5032269 | B2 | 9/2012 |
| JP | 2013-20509 | A | 1/2013 |
| JP | 2013-162097 | A | 8/2013 |
| JP | 5445766 | B2 | 3/2014 |
| JP | 2015183993 | A | 10/2015 |
| JP | 2018-009746 | A | 1/2018 |
| JP | 2019009359 | A | 1/2019 |
| WO | 2007073091 | A1 | 6/2007 |
| WO | 2012/066763 | A1 | 5/2012 |
| WO | 2019/021968 | A1 | 1/2019 |

OTHER PUBLICATIONS

Office Action issued in related Taiwanese Patent Application No. 109137322 dated Nov. 3, 2022 (14 pages).
Office Action issued in related U.S. Appl. No. 17/092,891 dated Jan. 10, 2023 (25 pages).
Office Action issued in related U.S. Appl. No. 17/100,227 dated Mar. 9, 2023 (8 pages).
Office Action issued in related Japanese Patent Application No. 2019-209955 dated Mar. 28, 2023 (9 pages).
Office Action issued in related Japanese Patent Application No. 2019-203218 dated Apr. 25, 2023 (5 pages).

* cited by examiner

TEMPERATURE CONTROL SYSTEM AND INTEGRATED TEMPERATURE CONTROL SYSTEM

CROSS REFERENCE TO RELATED APPLICATION

The present application is based on Japanese Patent Application No. 2019-203219 filed on Nov. 8, 2019, the entire content of which is incorporated herein by reference.

BACKGROUND

Technical Field

The present disclosure relates to a temperature control system for controlling the temperature of a control target.

Description of the Related Art

A conventional temperature adjustment system includes a heat exchanger for performing heat exchange between the heat exchanger and a temperature control target; a cooling side circulation circuit including a cooling means and a heat exchange fluid storage tank; a heating side circulation circuit including a heating means and a heat exchange fluid storage tank; and a switching valve for selectively connecting the cooling side circulation circuit and the heating side circulation circuit to the heat exchanger through switching, whereby a heat exchange fluid is circularly supplied to the heat exchanger (see Japanese Patent Application Laid-Open (kokai) No. 2001-134324).

In the temperature adjustment system (temperature control system) disclosed in Japanese Patent Application Laid-Open No. 2001-134324, a common heat exchange fluid (heat transfer medium) is circulated through the heat exchanger, the cooling side circulation circuit, and the heating side circulation circuit. Therefore, the amount of the heat exchange fluid supplied to the heat exchanger for circulation becomes excessively large, and the temperature of the heat exchange fluid cannot be changed quickly. Accordingly, the disclosed temperature adjustment system has room for improvement, in terms of enhancing responsiveness in controlling the temperature of a temperature control target (control target). Also, since a heat exchange fluid which can be used in a wide temperature range from low temperature to high temperature may be rather expensive, there has been a demand to reduce the amount of such an expensive heat exchange fluid to be used.

SUMMARY

One or more embodiments of the present invention provide a temperature control system which can reduce the amount of an expensive heat transfer medium to be used, and can enhance responsiveness in controlling the temperature of a control target.

One or more embodiments provide a temperature control system for controlling the temperature of a control target. The temperature control system includes a first circulation circuit through which a first heat transfer medium circulates, a second circulation circuit which is independent of the first circulation circuit and through which a second heat transfer medium circulates; and a third circulation circuit which is independent of the first circulation circuit and the second circulation circuit and through which a third heat transfer medium whose usable temperature range is wider than usable temperature ranges of the first heat transfer medium and the second heat transfer medium circulates.

The first circulation circuit includes a first expansion section which expands the first heat transfer medium in liquid state, thereby atomizing the first heat transfer medium, a first flow-through section (i.e., first flow-through path) through which the first heat transfer medium flows, a first supply path through which the first heat transfer medium atomized by the first expansion section and having a first temperature flows to the first flow-through section, a first compression section which compresses the first heat transfer medium in gas state, a first return path through which the first heat transfer medium having flowed through the first flow-through section and evaporated flows to the first compression section, and a first condensation section which condenses the first heat transfer medium in gas state compressed by the first compression section and supplies the condensed first heat transfer medium to the first expansion section.

The second circulation circuit includes a second adjustment apparatus which supplies the second heat transfer medium having a second temperature higher than the first temperature, a second flow-through section (i.e., second flow-through path) through which the second heat transfer medium flows, a second supply path through which the second heat transfer medium supplied from the second adjustment apparatus flows to the second flow-through section, and a second return path through which the second heat transfer medium having flowed through the second flow-through section flows to the second adjustment apparatus.

The third circulation circuit includes a third flow-through section (i.e., third flow-through path) through which the third heat transfer medium flows and which exchanges heat with the first flow-through section, a fourth flow-through section (i.e., fourth flow-through path) through which the third heat transfer medium flows and which exchanges heat with the second flow-through section, a third supply path through which the third heat transfer medium flows from the third flow-through section and the fourth flow-through section to a heat exchange section which exchanges heat with the control target, and a third return path through which the third heat transfer medium flows from the heat exchange section to the third flow-through section and the fourth flow-through section. The third circulation circuit includes no tank for storing the third heat transfer medium, and The temperature control system comprises an adjustment section which adjusts the amount of heat exchanged between the first flow-through section and the third flow-through section and the amount of heat exchanged between the second flow-through section and the fourth flow-through section.

According to the above-described configuration, the temperature control system controls the temperature of the control target. The temperature control system includes the first circulation circuit through which the first heat transfer medium circulates, the second circulation circuit which is independent of the first circulation circuit and through which the second heat transfer medium circulates, and the third circulation circuit. The third circulation circuit is independent of the first circulation circuit and the second circulation circuit, and the third heat transfer medium whose usable temperature range is wider than the usable temperature ranges of the first heat transfer medium and the second heat transfer medium circulates through the third circulation circuit. Therefore, the amount of the third heat transfer medium, which may be expensive, to be used can be reduced by causing the third heat transfer medium to circulate only through the third circulation circuit. In addition, the third circulation circuit does not include a tank for storing the third heat transfer medium. Therefore, the amount of the third heat transfer medium circulating through the third circulation circuit can be reduced further.

The first circulation circuit includes the first expansion section which expands the first heat transfer medium in liquid state, thereby atomizing the first heat transfer medium, the first flow-through section through which the first heat transfer medium flows, and the first supply path through which the first heat transfer medium of the first temperature atomized by the first expansion section flows to the first flow-through section. Therefore, the first heat transfer medium of the first temperature atomized through expansion can be caused to flow to the first flow-through section through the first supply path. The first flow-through section is caused to function as an evaporator so as to evaporate the first heat transfer medium at the first flow-through section, whereby thermal energy can be supplied to the first flow-through section (specifically, the first flow-through section can be cooled). Also, the first circulation circuit includes the first compression section which compresses the first heat transfer medium in gas state, the first return path through which the first heat transfer medium having flowed through the first flow-through section and evaporated flows to the first compression section, and the first condensation section which condenses the gas-state first heat transfer medium compressed by the first compression section and supplies the condensed first heat transfer medium to the first expansion section. Therefore, the first heat transfer medium having flowed through the first flow-through section and evaporated can be condensed, whereby the first heat transfer medium in liquid state can be supplied to the first expansion section. Since the first heat transfer medium whose usable temperature range is narrower than the usable temperature range of the third heat transfer medium is used, an inexpensive heat transfer medium can be used as the first heat transfer medium.

The second circulation circuit includes the second adjustment apparatus. The second adjustment apparatus supplies the second heat transfer medium having the second temperature higher than the first temperature. Therefore, the second heat transfer medium of the second temperature to be used for heat exchange can be supplied. The second circulation circuit includes the second flow-through section through which the second heat transfer medium flows, the second supply path through which the second heat transfer medium supplied from the second adjustment apparatus flows to the second flow-through section, and the second return path through which the second heat transfer medium having flowed through the second flow-through section flows to the second adjustment apparatus. Therefore, thermal energy can be supplied to the second flow-through section via the second heat transfer medium. Since the second heat transfer medium whose usable temperature range is narrower than the usable temperature range of the third heat transfer medium is used, an inexpensive heat transfer medium can be used as the second heat transfer medium.

The third circulation circuit includes the third flow-through section through which the third heat transfer medium flows and which exchanges heat with the first flow-through section, and the fourth flow-through section through which the third heat transfer medium flows and which exchanges heat with the second flow-through section. Therefore, the thermal energy supplied to the first flow-through section can be supplied to the third flow-through section through heat exchange between the first flow-through section and the third flow-through section. Similarly, the thermal energy supplied to the second flow-through section can be supplied to the fourth flow-through section through heat exchange between the second flow-through section and the fourth flow-through section.

The third circulation circuit includes the third supply path through which the third heat transfer medium flows from the third flow-through section and the fourth flow-through section to the heat exchange section which exchanges heat with the control target, and the third return path through which the third heat transfer medium flows from the heat exchange section to the third flow-through section and the fourth flow-through section. Therefore, via the third heat transfer medium, thermal energy can be supplied to the heat exchange section which exchanges heat with the control target. The temperature control system includes the adjustment section which adjusts the amount of heat exchanged between the first flow-through section and the third flow-through section and the amount of heat exchanged between the second flow-through section and the fourth flow-through section. Therefore, the thermal energy supplied to the third flow-through section and the fourth flow-through section can be adjusted by the adjustment section, whereby the thermal energy supplied to the heat exchange section via the third heat transfer medium can be adjusted; as a result, the temperature of the control target can be controlled. As described above, the amount of the third heat transfer medium circulating through the third circulation circuit can be reduced. Accordingly, the temperature of the third heat transfer medium can be changed quickly, whereby responsiveness in controlling the temperature of the control target can be enhanced.

In the case where the second adjustment apparatus must adjust the temperature of the second heat transfer medium to the second temperature and supply the temperature-adjusted second heat transfer medium, the second adjustment apparatus may include therein a unit having a configuration equivalent to that of the first circulation circuit. Through heat exchange between the heat transfer medium used in that unit and the second heat transfer medium, the temperature of the second heat transfer medium is adjusted to the second temperature. In such a case, the second circulation circuit must have a configuration for heat exchange between the second heat transfer medium and the heat transfer medium which undergoes atomization, compression, and condensation, and a configuration for heat exchange between the second heat transfer medium in the second flow-through section and the third heat transfer medium in the fourth flow-through section. In contrast, in the first circulation circuit, the heat transfer medium which undergoes atomization, compression, and condensation and the heat transfer medium caused to flow to the first flow-through section are the same heat transfer medium; i.e., the first heat transfer medium used in common, and the configuration for heat exchange between the first heat transfer medium and the heat transfer medium which undergoes atomization, compression, and condensation is unnecessary. Therefore, as compared with the second circulation circuit in the above-described case, the configuration of the first circulation circuit can be simplified. Further, when the first flow-through section and the third flow-through section exchange heat therebetween, the latent heat of the first heat transfer medium can be utilized, whereby the efficiency of heat exchange can be enhanced.

In one or more embodiments, the adjustment section includes a drive control section (i.e., controller) for controlling a drive state of the first compression section.

According to the above-described configuration, the drive state of the first compression section is controlled by the drive control section. Therefore, the degree of compression of the gas-state first heat transfer medium by the first compression section can be controlled; as a result, the amount of thermal energy supplied to the first flow-through section can be controlled. Accordingly, without controlling the flow rate of the first heat transfer medium flowing to the first flow-through section, the amount of heat exchanged between the first flow-through section and the third flow-through section can be adjusted, whereby the temperature of the control target can be controlled.

In one or more embodiments, the first circulation circuit includes a bypass flow passage which causes the evaporated first heat transfer medium to flow from the first return path to the first condensation section while bypassing the first compression section, and an on-off valve which opens and closes the bypass flow passage. When the on-off valve is opened, the drive control section stops the first compression section.

The above-described configuration allows the following operations. By closing the on-off valve, the evaporated first heat transfer medium can be caused to flow to the first compression section through the first return path without flowing through the bypass flow passage. Meanwhile, by opening the on-off valve, the evaporated first heat transfer medium can be caused to flow from the return path to the first condensation section through the bypass flow passage while bypassing the first compression section. When the on-off valve is opened, the drive control section stops the first compression section. Therefore, in the case where the amount of thermal energy which must be supplied to the first flow-through section is small, the consumption energy of the temperature control system can be reduced by stopping the first compression section.

Since the first compression section is designed to compress the first heat transfer medium in gas state, if the first compression section compresses the first heat transfer medium in liquid state, the first compression section may break. In the case where the amount of heat exchanged between the first flow-through section and the third flow-through section is small, the first heat transfer medium having flowed through the first flow-through section does not evaporate sufficiently, and the first heat transfer medium in liquid state may be supplied to the first compression section.

In view of the foregoing, in one or more embodiments, the first circulation circuit includes a connection flow passage which establishes communication between the first supply path and a flow passage between the first compression section and the first condensation section and through which the first heat transfer medium in gas state compressed by the first compression section flows to the first supply path, and an on-off valve which opens and closes the connection flow passage. By virtue of such a configuration, by opening the on-off valve, the gas-state first heat transfer medium compressed by the first compression section and having an increased temperature can be caused to flow to the first supply path through the connection flow passage. Therefore, even in the case where the amount of heat exchanged between the first flow-through section and the third flow-through section is small, the first heat transfer medium having flowed through the first flow-through section can be evaporated sufficiently, whereby the liquid-state first heat transfer medium is prevented from being supplied to the first compression section.

In one or more embodiments, the second adjustment apparatus includes a second expansion section which expands the second heat transfer medium in liquid state, thereby atomizing the second heat transfer medium and supplies the atomized second heat transfer medium to the second supply path, a second compression section to which the second heat transfer medium having flowed through the second flow-through section and evaporated is supplied through the second return path and which compresses the second heat transfer medium in gas state, and a second condensation section which condenses the second heat transfer medium in gas state compressed by the second compression section and supplies the condensed second heat transfer medium to the second expansion section.

According to the above-described configuration, as in the case of the first circulation circuit of one or more embodiments, in the second circulation circuit, the heat transfer medium which undergoes atomization, compression, and condensation and the heat transfer medium caused to flow to the second flow-through section are the same heat transfer medium; i.e. the second heat transfer medium used in common, and the configuration for heat exchange between the second heat transfer medium and the heat transfer medium which undergoes atomization, compression, and condensation is unnecessary. Therefore, the configuration of the second circulation circuit can be simplified. Further, when the second flow-through section and the fourth flow-through section exchange heat therebetween, the latent heat of the second heat transfer medium can be utilized, whereby the efficiency of heat exchange can be enhanced.

In one or more embodiments, the second adjustment apparatus includes a second compression section which compresses the second heat transfer medium in gas state and supplies the compressed second heat transfer medium to the second supply path, a second expansion section to which the second heat transfer medium having flowed through the second flow-through section and become liquid is supplied through the second return path and which expands the second heat transfer medium in liquid state, thereby atomizing the second heat transfer medium, and an evaporation section which evaporates the second heat transfer medium atomized by the second expansion section and supplies the evaporated second heat transfer medium to the second compression section.

The second adjustment apparatus includes the second compression section which compresses the second heat transfer medium in gas state and supplies the compressed second heat transfer medium to the second supply path. Therefore, the gas-state second heat transfer medium can be caused to flow to the second flow-through section through the second supply path. The second flow-through section is caused to function as a condenser so as to condense the second heat transfer medium at the second flow-through section, whereby thermal energy can be supplied to the second flow-through section (specifically, the second flow-through section can be heated). Also, the second adjustment apparatus includes the second expansion section to which the second heat transfer medium having flowed through the second flow-through section and become liquid is supplied through the second return path and which expands the second heat transfer medium in liquid state, thereby atomizing the second heat transfer medium, and the evaporation section which evaporates the second heat transfer medium atomized by the second expansion section and supplies the evaporated second heat transfer medium to the second compression section. Therefore, the second heat transfer medium having flowed through the second flow-through section and become liquid can be evaporated, whereby the gas-state second heat transfer medium can be supplied to the second compression section.

In this case, in the second circulation circuit, the heat transfer medium which undergoes compression, atomization, and evaporation and the heat transfer medium caused to flow to the second flow-through section are the same heat transfer medium; i.e. the second heat transfer medium used in common, and the configuration for heat exchange between the second heat transfer medium and the heat transfer medium which undergoes compression, atomization, and evaporation is unnecessary. Therefore, the configuration of the second circulation circuit can be simplified. Further, when the second flow-through section and the fourth flow-through section exchange heat therebetween, the latent heat of the second heat transfer medium can be utilized, whereby the efficiency of heat exchange can be enhanced.

In general, in a plant or the like, cooling water is available, and a plurality of cooling water sources which provide cooling water at different temperatures are available in some cases.

In view of the foregoing, in one or more embodiments, the first condensation section condenses the first heat transfer medium through heat exchange between the first heat transfer medium and cooling water of a first water temperature, and the evaporation section evaporates the second heat transfer medium through heat exchange between the second heat transfer medium and cooling water of a second water temperature higher than the first water temperature. According to such a configuration, in the case where a plurality of cooling water sources which supply cooling water at different temperatures are available, it is possible to use cooling water of a first water temperature for the first condensation section and use cooling water of a second water temperature higher than the first water temperature for the evaporation section. Accordingly, the consumption energy of the temperature control system can be reduced by effectively utilizing a plurality of cooling water sources which supply cooling water at different temperatures.

In one or more embodiments, the cooling water of the second water temperature is cooling water obtained as a result of the cooling water of the first water temperature being heated when used for cooling of a predetermined member.

According to the above-described configuration, cooling water whose temperature has risen from the first water temperature to the second water temperature as a result of being used for cooling of the predetermined member can be effectively used as the cooling water of the second water temperature. Therefore, even in the case where only the cooling water of the first water temperature is supplied in a plant or the like, the cooling water of the second water temperature can be supplied to the temperature control system.

In one or more embodiments, the first condensation section condenses the first heat transfer medium through heat exchange between cooling water and the first heat transfer medium, and the evaporation section evaporates the second heat transfer medium through heat exchange between cooling water and the second heat transfer medium. The temperature control system further comprises a pre-cooler which cools the cooling water supplied to the first condensation section by using the cooling water having flowed through the evaporation section, and a pre-heater which heats the cooling water supplied to the evaporation section by using the cooling water having flowed through the first condensation section.

According to the above-described configuration, the first condensation section condenses the first heat transfer medium through heat exchange between the cooling water and the first heat transfer medium. Therefore, cooling water of low temperature is needed in the first condensation section, and the temperature of the cooling water rises as a result of flow through the first condensation section. The evaporation section evaporates the second heat transfer medium through heat exchange between the cooling water and the second heat transfer medium. Therefore, cooling water of high temperature is needed in the evaporation section, and the temperature of the cooling water drops as a result of flow through the evaporation section.

The temperature control system includes the pre-cooler which cools the cooling water supplied to the first condensation section by using the cooling water having flowed through the evaporation section. Therefore, the cooling water having flowed through the evaporation section and having a decreased temperature can be used effectively for cooling the cooling water supplied to the first condensation section. Also, the temperature control system includes the pre-heater which heats the cooling water supplied to the evaporation section by using the cooling water having flowed through the first condensation section. Therefore, the cooling water having flowed through the first condensation section and having an increased temperature can be used effectively for heating the cooling water supplied to the evaporation section. Accordingly, the consumption energy of the temperature control system can be reduced.

In one or more embodiments, the second adjustment apparatus includes a heater which can control its heat generation amount.

According to the above-described configuration, the second adjustment apparatus includes the heater which can control its heat generation amount. Therefore, it is possible to supply the second heat transfer medium whose temperature is adjusted to the second temperature. In this case, in the second circulation circuit, the heat transfer medium heated by the heater and the heat transfer medium caused to flow to the second flow-through section are the same heat transfer medium; i.e. the second heat transfer medium used in common. Therefore, the configuration for heat exchange between the second heat transfer medium and the heat transfer medium which undergoes compression, atomization, and vaporization is unnecessary. Accordingly, the configuration of the second circulation circuit can be simplified.

In one or more embodiments, the first circulation circuit includes a first heat storage section (i.e., first heat storage) through which the first heat transfer medium flows and which stores thermal energy as a result of a state change of a first heat storage material at a third temperature. The first heat transfer medium atomized by the first expansion section flows to the first flow-through section and the first heat storage section through the first supply path. The first heat transfer medium having flowed through the first flow-through section and the first heat storage section and evaporated flows to the first compression section through the first return path. The second circulation circuit includes a second heat storage section (i.e., second heat storage) through which the second heat transfer medium flows and which stores thermal energy as a result of a state change of a second heat storage material at a fourth temperature higher than the third temperature. The second heat transfer medium supplied from the second adjustment apparatus flows to the second flow-through section and the second heat storage section through the second supply path. The second heat transfer medium having flowed through the second flow-through section and the second heat storage section flows to the second adjustment apparatus through the second return path.

According to the above-described configuration, the first circulation circuit includes the first heat storage section, the first supply path through which the first heat transfer medium atomized by the first expansion section flows to the first flow-through section and the first heat storage section, and the first return path through which the first heat transfer medium having flowed through the first flow-through section and the first heat storage section and evaporated flows to the first compression section. Therefore, thermal energy can be supplied to the first flow-through section and the first heat storage section via the first heat transfer medium. The first heat storage section, through which the first heat transfer medium flows, stores thermal energy as a result of the state change of the first heat storage material at the third temperature. Therefore, thermal energy can be stored in the first heat storage section, for example, for preparation for changing the temperature of the control target. Also, in the second circulation circuit, the second adjustment apparatus supplies the second heat transfer medium of the second temperature higher than the first temperature. Therefore, the second circulation circuit can achieve an action and an effect similar to those of the first circulation circuit.

When the thermal energy supplied to the third flow-through section and the fourth flow-through section is adjusted by the adjustment section, the thermal energies stored in the first heat storage section and the second heat storage section can be used. Therefore, the amount of thermal energy supplied to the third flow-through section and the fourth flow-through section can be increased, and the temperature of the third heat transfer medium can be changed quickly. Accordingly, responsiveness in controlling the temperature of the control target can be enhanced further.

In one or more embodiments, the adjustment section includes a first distribution valve which is provided in the first supply path and changes the ratio at which the first heat transfer medium atomized by the first expansion section is distributed between the first flow-through section and the first heat storage section, and a second distribution valve which is provided in the second supply path and changes the ratio at which the second heat transfer medium supplied from the second adjustment apparatus is distributed between the second flow-through section and the second heat storage section.

According to the above-described configuration, the first distribution valve is provided in the first supply path so as to change the ratio at which the first heat transfer medium atomized by the first expansion section is distributed between the first flow-through section and the first heat storage section. Therefore, the ratio between thermal energy supplied from the first expansion section to the first flow-through section and thermal energy supplied from the first expansion section to the first heat storage section can be changed by the first distribution valve. Accordingly, the ratio between the thermal energy used for heat exchange between the first flow-through section and the third flow-through section and the thermal energy stored in the first heat storage section can be changed. Similarly, the ratio between the thermal energy used for heat exchange between the second flow-through section and the fourth flow-through section and the thermal energy stored in the second heat storage section can be changed.

In one or more embodiments, the temperature control system includes a control section (i.e., controller) which controls the first distribution valve and the second distribution valve. When the control section controls the first distribution valve such that the first heat transfer medium atomized by the first expansion section flows to the first flow-through section, the control section controls the second distribution valve such that the second heat transfer medium supplied from the second adjustment apparatus flows to the second heat storage section. When the control section controls the second distribution valve such that the second heat transfer medium supplied from the second adjustment apparatus flows to the second flow-through section, the control section controls the first distribution valve such that the first heat transfer medium atomized by the first expansion section flows to the first heat storage section.

According to the above-described configuration, the temperature control system includes the control section for controlling the first distribution valve and the second distribution valve. When the control section controls the first distribution valve such that the first heat transfer medium atomized by the first expansion section flows to the first flow-through section, the control section controls the second distribution valve such that the second heat transfer medium supplied from the second adjustment apparatus flows to the second heat storage section. Therefore, in the case where the first heat transfer medium atomized by the first expansion section is caused to flow through the first flow-through section; namely, in the case where the necessity of heat exchange between the second flow-through section and the fourth flow-through section is small, thermal energy can be stored in the second heat storage section. Meanwhile, in the case where the second heat transfer medium supplied from the second adjustment apparatus is caused to flow through the second flow-through section; namely, in the case where the necessity of heat exchange between the first flow-through section and the third flow-through section is small, thermal energy can be stored in the first heat storage section.

In one or more embodiments, the adjustment section includes a third distribution valve which is provided in the third return path and which changes the ratio between the third heat transfer medium flowing from the heat exchange section to the third flow-through section and the third heat transfer medium flowing from the heat exchange section to the fourth flow-through section.

According to the above-described configuration, the third distribution valve is provided in the third return path so as to change the ratio between the third heat transfer medium flowing from the heat exchange section to the third flow-through section and the third heat transfer medium flowing from the heat exchange section to the fourth flow-through section. Therefore, the ratio between the thermal energy that the third flow-through section receives from the first flow-through section and the thermal energy that the fourth flow-through section receives from the second flow-through section can be changed by the third distribution valve. Further, for example, by causing the third heat transfer medium to flow from the heat exchange section only to the fourth flow-through section, it is possible to prevent the heat exchange between the first flow-through section and the third flow-through section, which heat exchange would otherwise occur when the third heat transfer medium flows to the third flow-through section. Notably, in the case where the third heat transfer medium flows through the third flow-through section, even when the first heat transfer medium does not flow through the first flow-through section, the thermal energy remaining in the first flow-through section may be supplied to the third flow-through section. From this viewpoint, the above-described configuration can further enhance responsiveness in controlling the temperature of the control target.

In one or more embodiments, the adjustment section includes a third distribution valve which is provided in the third return path and which changes the ratio between the third heat transfer medium flowing from the heat exchange section to the third flow-through section and the third heat transfer medium flowing from the heat exchange section to the fourth flow-through section. The temperature control system further comprises a control section which controls the first distribution valve, the second distribution valve, and the third distribution valve. When the control section controls the third distribution valve such that the third heat transfer medium does not flow from the heat exchange section to the third flow-through section, the control section controls the first distribution valve such that the first heat transfer medium atomized by the first expansion section flows to the first heat storage section. When the control section controls the third distribution valve such that the third heat transfer medium does not flow from the heat exchange section to the fourth flow-through section, the control section controls the second distribution valve such that the second heat transfer medium supplied from the second adjustment apparatus flows to the second heat storage section.

According to the above-described configuration, the temperature control system includes the control section for controlling the first distribution valve, the second distribution valve, and the third distribution valve. In the case where the control section controls the third distribution valve such that the third heat transfer medium does not flow from the heat exchange section to the third flow-through section, the control section controls the first distribution valve such that the first heat transfer medium atomized by the first expansion section flows to the first heat storage section. Therefore, in the case where the third heat transfer medium is not caused to flow from the heat exchange section to the third flow-through section; namely, in the case where it is unnecessary to perform heat exchange between the first flow-through section and the third flow-through section, thermal energy can be stored in the first heat storage section. Meanwhile, in the case where the third heat transfer medium is not caused to flow from the heat exchange section to the fourth flow-through section; namely, in the case where it is unnecessary to perform heat exchange between the second flow-through section and the fourth flow-through section, thermal energy can be stored in the second heat storage section.

In one or more embodiments, the third return path includes a first intermediary return path through which the third heat transfer medium flows from the heat exchange section to the third flow-through section through the first heat storage section, and a second intermediary return path through which the third heat transfer medium flows from the heat exchange section to the fourth flow-through section through the second heat storage section.

According to the above-described configuration, the third return path includes the first intermediary return path through which the third heat transfer medium flows from the heat exchange section to the third flow-through section through the first heat storage section. Therefore, in the case where the third heat transfer medium is caused to flow from the heat exchange section to the third flow-through section, thermal energy can be supplied directly to the third heat transfer medium from the first heat storage section. Similarly, in the case where the third heat transfer medium is caused to flow from the heat exchange section to the fourth flow-through section, thermal energy can be supplied directly to the third heat transfer medium from the second heat storage section. Accordingly, responsiveness in controlling the temperature of the control target can be enhanced further.

In one or more embodiments, the adjustment section includes a fourth distribution valve which is provided in the third return path and which changes the ratio among the third heat transfer medium flowing from the heat exchange section to the third flow-through section, the third heat transfer medium flowing out of the heat exchange section and returning to the heat exchange section without flowing through the third flow-through section and the fourth flow-through section, and the third heat transfer medium flowing from the heat exchange section to the fourth flow-through section.

According to the above-described configuration, the third distribution valve is provided in the third return path so as to change the ratio among the third heat transfer medium flowing from the heat exchange section to the third flow-through section, the third heat transfer medium flowing out of the heat exchange section and returning to the heat exchange section without flowing through the third flow-through section and the fourth flow-through section, and the third heat transfer medium flowing from the heat exchange section to the fourth flow-through section. Therefore, the ratio among the thermal energy that the third flow-through section receives from the first flow-through section, the thermal energy returned to the heat exchange section, and the thermal energy that the fourth flow-through section receives from the second flow-through section can be changed by the fourth distribution valve. Further, it is possible to realize a state in which the third heat transfer medium flowing out of the heat exchange section is returned as it is to the heat exchange section without allowing the third heat transfer medium to flow from the heat exchange section to the third flow-through section and the fourth flow-through section.

In one or more embodiments, a temperature control system controls the temperature of a control target. The temperature control system includes a first circulation circuit through which a first heat transfer medium circulates, a heater which heats the control target and can control its heat generation amount, and a third circulation circuit which is independent of the first circulation circuit and through which a third heat transfer medium whose usable temperature range is wider than a usable temperature range of the first heat transfer medium circulates.

The first circulation circuit includes a first expansion section which expands the first heat transfer medium in liquid state, thereby atomizing the first heat transfer medium, a first flow-through section through which the first heat transfer medium flows, a first supply path through which the first heat transfer medium atomized by the first expansion section and having a first temperature flows to the first flow-through section, a first compression section which compresses the first heat transfer medium in gas state, a first return path through which the first heat transfer medium having flowed through the first flow-through section and evaporated flows to the first compression section, and a first condensation section which condenses the first heat transfer medium in gas state compressed by the first compression section and supplies the condensed first heat transfer medium to the first expansion section.

The third circulation circuit includes a third flow-through section through which the third heat transfer medium flows and which exchanges heat with the first flow-through section, a third supply path through which the third heat transfer medium flows from the third flow-through section to a heat exchange section which exchanges heat with the control target, and a third return path through which the third heat transfer medium flows from the heat exchange section to the third flow-through section. The third circulation circuit includes no tank for storing the third heat transfer medium. The temperature control system comprises an adjustment section which adjusts the amount of heat exchanged between the first flow-through section and the third flow-through section and the heat generation amount of the heater.

According to the above-described configuration, the third circulation circuit is independent of the first circulation circuit, and the third heat transfer medium whose usable temperature range is wider than that of the first heat transfer medium circulates through the third circulation circuit. Therefore, the third heat transfer medium, which may be expensive, is caused to circulate only through the third circulation circuit, whereby the amount of the third heat transfer medium to be used can be reduced. Additionally, the third circulation circuit does not include a tank for storing the third heat transfer medium. Therefore, the amount of the third heat transfer medium circulating through the third circulation circuit can be reduced further.

The first circulation circuit achieves the same action and effect as those of the above-described embodiments. Since the first heat transfer medium whose usable temperature range is narrower than that of the third heat transfer medium is used, an inexpensive heat transfer medium can be used as the first heat transfer medium. The heater heats the control target and can control the amount of heat generated. Therefore, the control target can be heated directly without use of any heat transfer medium.

The temperature control system includes the adjustment section which adjusts the amount of heat exchanged between the first flow-through section and the third flow-through section and the heat generation amount of the heater. Therefore, the thermal energy supplied to the third flow-through section and the thermal energy supplied directly to the control target can be adjusted by the adjustment section, whereby the temperature of the control target can be controlled. As described above, the amount of the third heat transfer medium circulating through the third circulation circuit can be reduced. Accordingly, the temperature of the third heat transfer medium can be changed quickly, whereby responsiveness in controlling the temperature of the control target can be enhanced.

In one or more embodiments, an integrated temperature control system includes a plurality of temperature control systems according to any one of the above-described embodiments, wherein a single set including the first expansion section, the first compression section, and the first condensation section is provided for the plurality of temperature control systems. By virtue of such a configuration, the single set including the first expansion section for supplying the atomized first heat transfer medium of the first temperature, the first compression section, and the first condensation section can be shared by the plurality of temperature control systems. Therefore, the configuration of the integrated temperature control system including the plurality of temperature control systems can be simplified.

Each of the temperature control systems controls the temperature of the control target by adjusting the amount of heat exchanged between the first flow-through section and the third flow-through section by using the adjustment section. Therefore, the first expansion section is required only to supply the atomized first heat transfer medium of the constant first temperature, and is not required to change the temperature of the first heat transfer medium in accordance with a change in the target temperature of the control target. Accordingly, even in the case of a configuration in which a single set of the first expansion section, the first compression section, and the first condensation section is provided for a plurality of temperature control systems, the temperature of the control target of each temperature control system can be controlled. Notably, instead of the temperature of the control target, a physical quantity correlating with the temperature of the control target may be controlled.

BRIEF DESCRIPTION OF THE DRAWINGS

The above and other features and advantages of the present invention will be apparent from the following description made with reference to the accompanying drawings.

DETAILED DESCRIPTION

First Embodiment

A first embodiment will now be described with reference to the drawings. The first embodiment is embodied as a temperature control system for controlling the temperature of a lower electrode (control target) of a semiconductor manufacturing apparatus.

Figure 1:
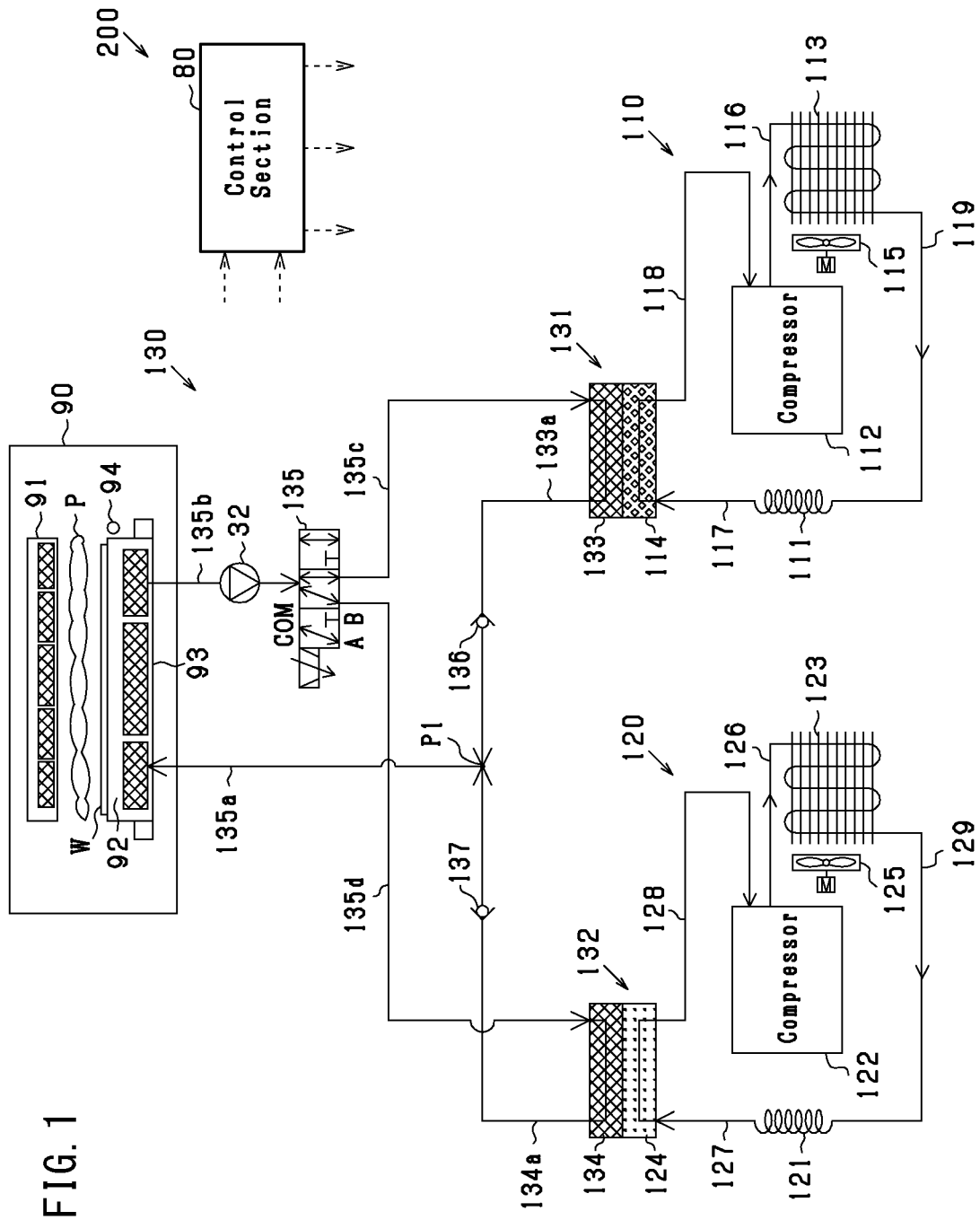
FIG. 1 is a schematic diagram of a temperature control system according to a first embodiment.

As shown in FIG. 1, a temperature control system 200 includes a first circulation circuit 110, a second circulation circuit 120, a third circulation circuit 130, a control section 80, etc.

The first circulation circuit 110 is a circuit through which a first heat transfer medium circulates. The first heat transfer medium is, for example, a hydrofluorocarbon (HFC)-based refrigerant or a hydrofluoroolefin (HFO)-based refrigerant. The second circulation circuit 120 is a circuit which is independent of the first circulation circuit 110 and through which a second heat transfer medium circulates. The second heat transfer medium is, for example, the same refrigerant as the first heat transfer medium. The first heat transfer medium and the second heat transfer medium are relatively inexpensive.

The third circulation circuit 130 is a circuit which is independent of the first circulation circuit 110 and the second circulation circuit 120 and through which a third heat transfer medium circulates. The third heat transfer medium is, for example, a fluorine-based inert liquid. The lowest usable temperature of the third heat transfer medium is lower than those of the first heat transfer medium and the second heat transfer medium. The highest usable temperature of the third heat transfer medium is higher than those of the first heat transfer medium and the second heat transfer medium. Namely, the usable temperature range of the third heat transfer medium is wider than those of the first heat transfer medium and the second heat transfer medium. Therefore, the third heat transfer medium is more expensive than the first heat transfer medium and the second heat transfer medium.

The first circulation circuit 110 includes a first expansion section 111, a first compressor 112, a first condenser 113, a first fan 115, a first flow-through section 114, etc.

The first expansion section 111 is an expansion valve or a capillary which expands the first heat transfer medium in liquid state, thereby atomizing the first heat transfer medium. The first expansion section 111 and the first flow-through section 114 are connected to each other by a flow passage 117. The first heat transfer medium atomized by the first expansion section 111 and having a first temperature flows to the first flow-through section 114 through the flow passage 117 (first supply path).

The first flow-through section 114 is provided inside a heat exchanger 131, and the first heat transfer medium flows through the first flow-through section 114. The first flow-through section 114 functions as an evaporator which evaporates the atomized first heat transfer medium. The first flow-through section 114 and the first compressor 112 are connected to each other by a flow passage 118. The first heat transfer medium having flowed through the first flow-through section 114 and evaporated flows to the first compressor 112 through the flow passage 118 (first return path).

The first compressor 112 (first compression section) compresses the gas-state first heat transfer medium. The temperature of the first heat transfer medium rises as a result of compression of the first heat transfer medium by the first compressor 112. The first compressor 112 and the first condenser 113 are connected to each other by a flow passage 116.

The first condenser 113 (first condensation section) condenses the gas-state first heat transfer medium compressed by the first compressor 112 and supplies the condensed first heat transfer medium to the above-described first expansion section 111. At that time, the first fan 115 air-cools the first heat transfer medium flowing through the first condenser 113. The first condenser 113 and the above-described first expansion section 111 are connected to each other by a flow passage 119.

The second circulation circuit 120 includes a second expansion section 121, a second compressor 122, a second condenser 123, a second fan 125, a second flow-through section 124, etc.

The second expansion section 121 is an expansion valve or a capillary which expands the second heat transfer medium in liquid state, thereby atomizing the second heat transfer medium. The second expansion section 121 and the second flow-through section 124 are connected to each other by a flow passage 127. The second heat transfer medium atomized by the second expansion section 121 and having a second temperature higher than the above-described first temperature flows to the second flow-through section 124 through the flow passage 127 (second supply path).

The second flow-through section 124 is provided inside a heat exchanger 132, and the second heat transfer medium flows through the second flow-through section 124. The second flow-through section 124 functions as an evaporator which evaporates the atomized second heat transfer medium. The second flow-through section 124 and the second compressor 122 are connected to each other by a flow passage 128. The second heat transfer medium having flowed through the second flow-through section 124 and evaporated flows to the second compressor 122 through the flow passage 128 (second return path).

The second compressor 122 (second compression section) compresses the gas-state second heat transfer medium. The temperature of the second heat transfer medium rises as a result of compression of the second heat transfer medium by the second compressor 122. The second compressor 122 and the second condenser 123 are connected to each other by a flow passage 126.

The second condenser 123 (second condensation section) condenses the gas-state second heat transfer medium compressed by the second compressor 122 and supplies the condensed second heat transfer medium to the second expansion section 121. At that time, the second fan 125 air-cools the second heat transfer medium flowing through the second condenser 123. Notably, the degree of cooling of the second heat transfer medium by the second fan 125 may be made smaller than the degree of cooling of the first heat transfer medium by the first fan 115. The second condenser 123 and the above-described second expansion section 121 are connected to each other by a flow passage 129.

The third circulation circuit 130 includes a third flow-through section 133, a fourth flow-through section 134, a third distribution valve 135, a first check valve 136, a second check valve 137, a pump 32, etc.

The third flow-through section 133 is provided inside the heat exchanger 131, and the third heat transfer medium flows through the third flow-through section 133. The third flow-through section 133 is integrated with the first flow-through section 114 and exchanges heat with the first flow-through section 114.

A flow passage 133a is connected to the third flow-through section 133. The first check valve 136 is provided in the flow passage 133a. The first check valve 136 permits the third heat transfer medium to flow from the third flow-through section 133 to a merging point P1 and prohibits the third heat transfer medium from flowing from the merging point P1 to the third flow-through section 133.

A flow passage 134a is connected to the fourth flow-through section 134. The second check valve 137 is provided in the flow passage 134a. The second check valve 137 permits the third heat transfer medium to flow from the fourth flow-through section 134 to the merging point P1 and prohibits the third heat transfer medium from flowing from the merging point P1 to the fourth flow-through section 134. The flow passage 133a and the flow passage 134a are connected to the flow passage 135a at the merging point P1.

A semiconductor manufacturing apparatus 90 includes an upper electrode 91 and a lower electrode 92 and generates plasma P between the upper electrode 91 and the lower electrode 92. A workpiece W such as a wafer is placed on the lower electrode 92. A temperature sensor 94 detects the temperature of the lower electrode 92. The lower electrode 92 is integrated with a heat exchanger 93. Heat exchange is performed between the heat exchanger 93 and the lower electrode 92.

The flow passage 135a is connected to the inlet port of the heat exchanger 93. The third heat transfer medium flows through the heat exchanger 93 (heat exchange section). A flow passage 135b is connected to the outlet port of the heat exchanger 93. The pump 32 is provided in the flow passage 135b. The flow passage 135b is connected to the common port of the third distribution valve 135. In the flow passage 135b, the pump 32 sucks the third heat transfer medium from the heat exchanger 93 side and discharges the third heat transfer medium to the third distribution valve 135 side (the third flow-through section 133 side, the fourth flow-through section 134 side).

The third distribution valve 135 (adjustment section) is a three-way valve having the common port, an A port, and a B port. A flow passage 135c is connected to the B port. A flow passage 135d is connected to the A port. The flow passage 135c is connected to the third flow-through section 133 of the heat exchanger 131. The flow passage 135d is connected to the fourth flow-through section 134 of the heat exchanger 132.

The third distribution valve 135 continuously changes the ratio between the flow rate of the third heat transfer medium flowing from the flow passage 135b to the flow passage 135c and the flow rate of the third heat transfer medium flowing from the flow passage 135b to the flow passage 135d. Namely, the third distribution valve 135 changes the ratio between the third heat transfer medium flowing from the heat exchanger 93 to the third flow-through section 133 and the third heat transfer medium flowing from the heat exchanger 93 to the fourth flow-through section 134. The third distribution valve 135 continuously changes the state of flow between a state in which all (100%) of the third heat transfer medium flows from the flow passage 135b to the flow passage 135c and a state in which all (100%) of the third heat transfer medium flows from the flow passage 135b to the flow passage 135d. In the third distribution valve 135, the pressure loss of the third heat transfer medium is constant irrespective of the ratio at which the third heat transfer medium supplied from the pump 32 is distributed between the third flow-through section 133 of the heat exchanger 131 and the fourth flow-through section 134 of the heat exchanger 132.

Since the load of the pump 32 does not change irrespective of the distribution ratio of the third distribution valve 135, the pump 32 is driven in a constant drive state. As a result, the pump 32 circulates the third heat transfer medium through the third circulation circuit 130. The third circulation circuit 130 does not include a tank for storing the third heat transfer medium. Notably, the flow passages 133a, 134a, and 135a form a third supply path. The flow passages 135b, 135c, and 135d form a third return path.

The control section 80 is a microcomputer including a CPU, a ROM, a RAM, an input/output interface, etc. The control section 80 receives the result of detection by the temperature sensor 94 (i.e., the temperature detected by the temperature sensor 94). The control section 80 controls the temperature of the lower electrode 92 to a set temperature. The set temperature (target temperature) is changed to, for example, 90° C., 0° C., or −20° C. in accordance with a process in the semiconductor manufacturing apparatus 90. Since heat flows from the plasma P into the lower electrode 92, the temperature of the lower electrode 92 may rise to about 120° C. upon generation of the plasma P. As a result of the temperature rise, the temperature of the third heat transfer medium flowing out of the heat exchanger 93 may also rise to a temperature close to 120° C.

The control section 80 (drive control section) controls the drive states of the first compressor 112 and the second compressor 122. Specifically, the control section 80 controls the drive states of the first compressor 112 and the second compressor 122 such that the degree of compression of the first heat transfer medium by the first compressor 112 becomes greater than the degree of compression of the second heat transfer medium by the second compressor 122. The control section 80 controls the distribution ratio of the third distribution valve 135 on the basis of the set temperature of the lower electrode 92 and the temperature detected by the temperature sensor 94. Thus, the flow rate of the third heat transfer medium flowing through the third flow-through section 133 is adjusted; as a result, the amount of heat exchanged between the first flow-through section 114 and the third flow-through section 133 is adjusted. Also, the flow rate of the third heat transfer medium flowing through the fourth flow-through section 134 is adjusted; as a result, the amount of heat exchanged between the second flow-through section 124 and the fourth flow-through section 134 is adjusted.

The first embodiment of the present invention having been described in detail above has the following advantages.

The third circulation circuit 130 is independent of the first circulation circuit 110 and the second circulation circuit 120, and the third heat transfer medium whose usable temperature range is wider than those of the first heat transfer medium and the second heat transfer medium circulates through the third circulation circuit 130. Therefore, the third heat transfer medium, which may be expensive, is caused to circulate only through the third circulation circuit 130, whereby the amount of the third heat transfer medium to be used can be reduced. Additionally, the third circulation circuit 130 does not include a tank for storing the third heat transfer medium. Therefore, the amount of the third heat transfer medium circulating through the third circulation circuit 130 can be reduced further.

The first heat transfer medium and the second heat transfer medium whose usable temperature ranges are narrower than that of the third heat transfer medium are used in the first circulation circuit 110 and the second circulation circuit 120, respectively. Therefore, inexpensive heat transfer mediums can be used as the first heat transfer medium and the second heat transfer medium.

The first circulation circuit 110 includes the first expansion section 111 which expands the first heat transfer medium in liquid state, thereby atomizing the first heat transfer medium, the first flow-through section 114 through which the first heat transfer medium flows, and the flow passage 117 through which the first heat transfer medium atomized by the first expansion section 111 and having the first temperature flows to the first flow-through section 114. Therefore, the expanded and atomized first heat transfer medium of the first temperature can be caused to flow to the first flow-through section 114 through the flow passage 117. The first flow-through section 114 is caused to function as an evaporator, to thereby evaporate the first heat transfer medium at the first flow-through section 114. As a result, thermal energy can be supplied to the first flow-through section 114 (specifically, the first flow-through section 114 can be cooled). The second circulation circuit 120 can achieve the same action and effect.

The first circulation circuit 110 includes the first compressor 112 which compresses the first heat transfer medium in gas state, the flow passage 118 through which the first heat transfer medium having flowed through the first flow-through section 114 and evaporated flows to the first compressor 112, and the first condenser 113 which condenses the gas-state first heat transfer medium compressed by the first compressor 112 and supplies the condensed first heat transfer medium to the first expansion section 111. Therefore, the first heat transfer medium having flowed through the first flow-through section 114 and evaporated can be condensed, and the first heat transfer medium in liquid state can be supplied to the first expansion section 111. The second circulation circuit 120 can achieve the same action and effect.

The third circulation circuit 130 includes the third flow-through section 133 through which the third heat transfer medium flows and which exchanges heat with the first flow-through section 114, and the fourth flow-through section 134 through which the third heat transfer medium flows and which exchanges heat with the second flow-through section 124. Therefore, thermal energy supplied to the first flow-through section 114 can be supplied to the third flow-through section 133 through heat exchange between the first flow-through section 114 and the third flow-through section 133. Similarly, thermal energy supplied to the second flow-through section 124 can be supplied to the fourth flow-through section 134 through heat exchange between the second flow-through section 124 and the fourth flow-through section 134.

Figure 8:
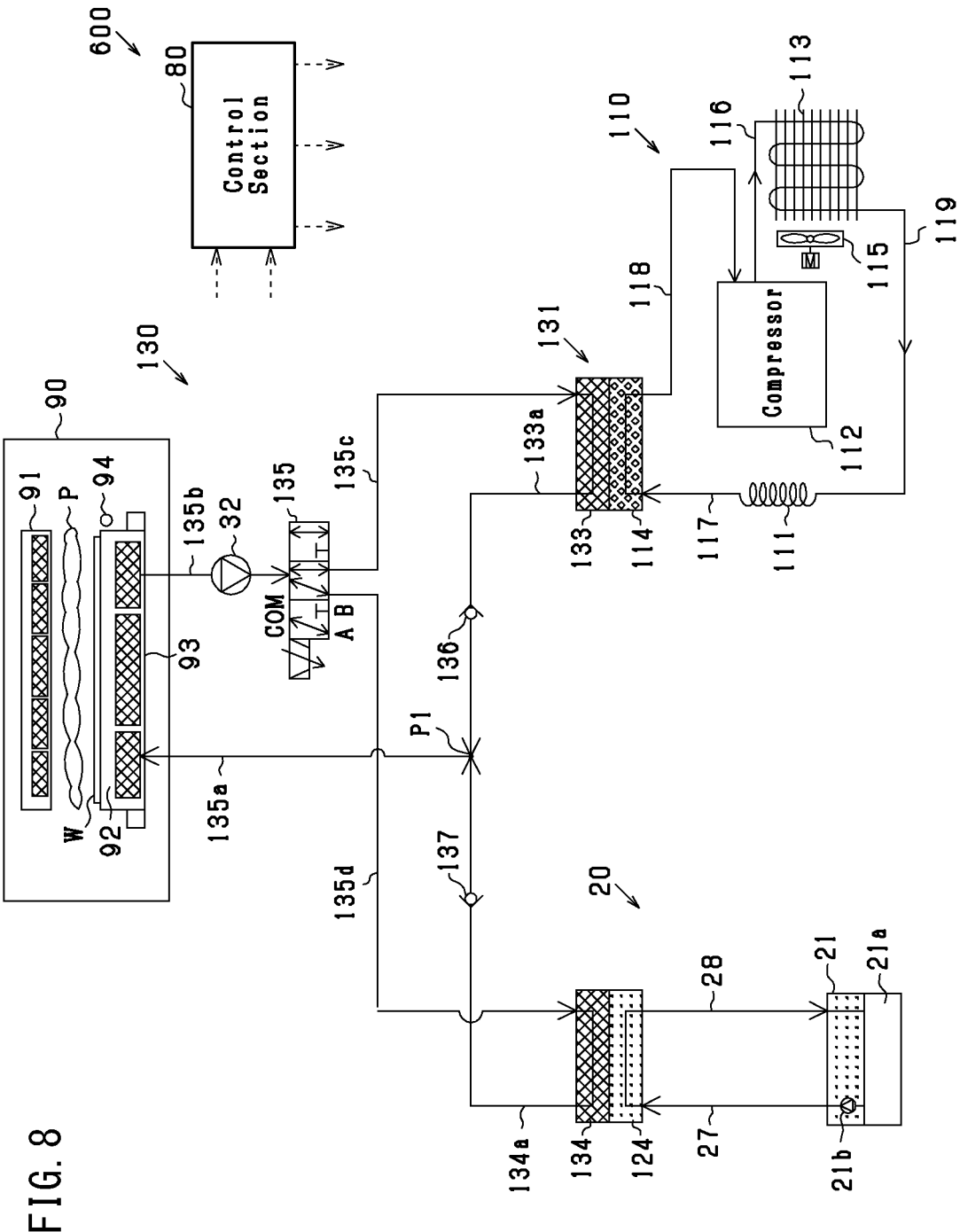
FIG. 8 is a schematic diagram of a temperature control system according to a fifth embodiment.

In the case where a second chiller 21 must adjust the temperature of the second heat transfer medium to the second temperature and supply the temperature-adjusted second heat transfer medium as shown in FIG. 8, the second chiller 21 may include therein a unit having a configuration equivalent to that of the second circulation circuit 120. Through heat exchange between the heat transfer medium used in that unit and the second heat transfer medium, the temperature of the second heat transfer medium is adjusted to the second temperature. In such a case, a second circulation circuit 20 shown in FIG. 8 must have a configuration for heat exchange between the second heat transfer medium and the heat transfer medium which undergoes atomization, compression, and condensation, and a configuration for heat exchange between the second heat transfer medium in the second flow-through section 124 and the third heat transfer medium in the fourth flow-through section 134. In contrast, in the second circulation circuit 120, the heat transfer medium which undergoes atomization, compression, and condensation and the heat transfer medium caused to flow to the second flow-through section 124 are the same heat transfer medium; i.e. the second heat transfer medium used in common, and the configuration for heat exchange between the second heat transfer medium and the heat transfer medium which undergoes atomization, compression, and condensation is unnecessary. Therefore, as compared with the second circulation circuit 20, the configuration of the second circulation circuit 120 can be simplified. Further, when the second flow-through section 124 and the fourth flow-through section 134 exchange heat therebetween, the latent heat of the second heat transfer medium can be utilized, whereby the efficiency of heat exchange can be enhanced. The first circulation circuit 110 can achieve the same action and effect.

The third circulation circuit 130 includes the flow passages 133a, 134a, and 135a through which the third heat transfer medium flows from the third flow-through section 133 and the fourth flow-through section 134 to the heat exchanger 93, which exchanges heat with the lower electrode 92, and the flow passages 135b, 135c, and 135d through which the third heat transfer medium flows from the heat exchanger 93 to the third flow-through section 133 and the fourth flow-through section 134. Therefore, thermal energy can be supplied, via the third heat transfer medium, to the heat exchanger 93, which exchanges heat with the lower electrode 92.

The drive state of the first compressor 112 is controlled by the control section 80. Therefore, the degree of compression of the gas-state first heat transfer medium by the first compressor 112 can be controlled; as a result, the amount of thermal energy supplied to the first flow-through section 114 can be controlled. Accordingly, without controlling the flow rate of the first heat transfer medium flowing to the first flow-through section 114, the amount of heat exchanged between the first flow-through section 114 and the third flow-through section 133 can be adjusted, whereby the temperature of the lower electrode 92 can be controlled. Similarly, since the drive state of the second compressor 122 is controlled by the control section 80, the amount of heat exchanged between the second flow-through section 124 and the fourth flow-through section 134 can be adjusted, whereby the temperature of the lower electrode 92 can be controlled.

The third circulation circuit 130 includes the third distribution valve 135 which changes the ratio between the third heat transfer medium flowing from the heat exchanger 93 to the third flow-through section 133 and the third heat transfer medium flowing from the heat exchanger 93 to the fourth flow-through section 134. Therefore, the ratio between the thermal energy that the third flow-through section 133 receives from the first flow-through section 114 and the thermal energy that the fourth flow-through section 134 receives from the second flow-through section 124 can be changed by the third distribution valve 135. Further, for example, by causing the third heat transfer medium from the heat exchanger 93 to flow only to the fourth flow-through section 134, it is possible to prevent the heat exchange between the first flow-through section 114 and the third flow-through section 133, which heat exchange would otherwise occur when the third heat transfer medium flows through the third flow-through section 133. Notably, in the case where the third heat transfer medium flows through the third flow-through section 133, even when the first heat transfer medium does not flow through the first flow-through section 114, the thermal energy remaining in the first flow-through section 114 may be supplied to the third flow-through section 133. From this viewpoint, the above-described configuration can further enhance responsiveness in controlling the temperature of the lower electrode 92.

In the third distribution valve 135, the pressure loss of the third heat transfer medium is constant irrespective of the ratio between the third heat transfer medium flowing from the heat exchanger 93 to the third flow-through section 133 and the third heat transfer medium flowing from the heat exchanger 93 to the fourth flow-through section 134. Therefore, in the case where the third heat transfer medium is circulated through the third circulation circuit 130 by the pump 32, it is unnecessary to control the drive state of the pump 32, and the pump 32 can be driven in a constant drive state.

Notably, the first embodiment may be modified as follows. Portions identical with those of the first embodiment are denoted by the same reference numerals, and their description will not be repeated.

In the third distribution valve 135, the pressure loss of the third heat transfer medium may change in accordance with the ratio between the third heat transfer medium flowing from the heat exchanger 93 to the third flow-through section 133 and the third heat transfer medium flowing from the heat exchanger 93 to the fourth flow-through section 134. In such a case, the drive state of the pump 32 is changed appropriately.

The control section 80 may control time periods during which the first compressor 112 is turned on by switching the drive state of the first compressor 112 between on and off states.

Figure 2:
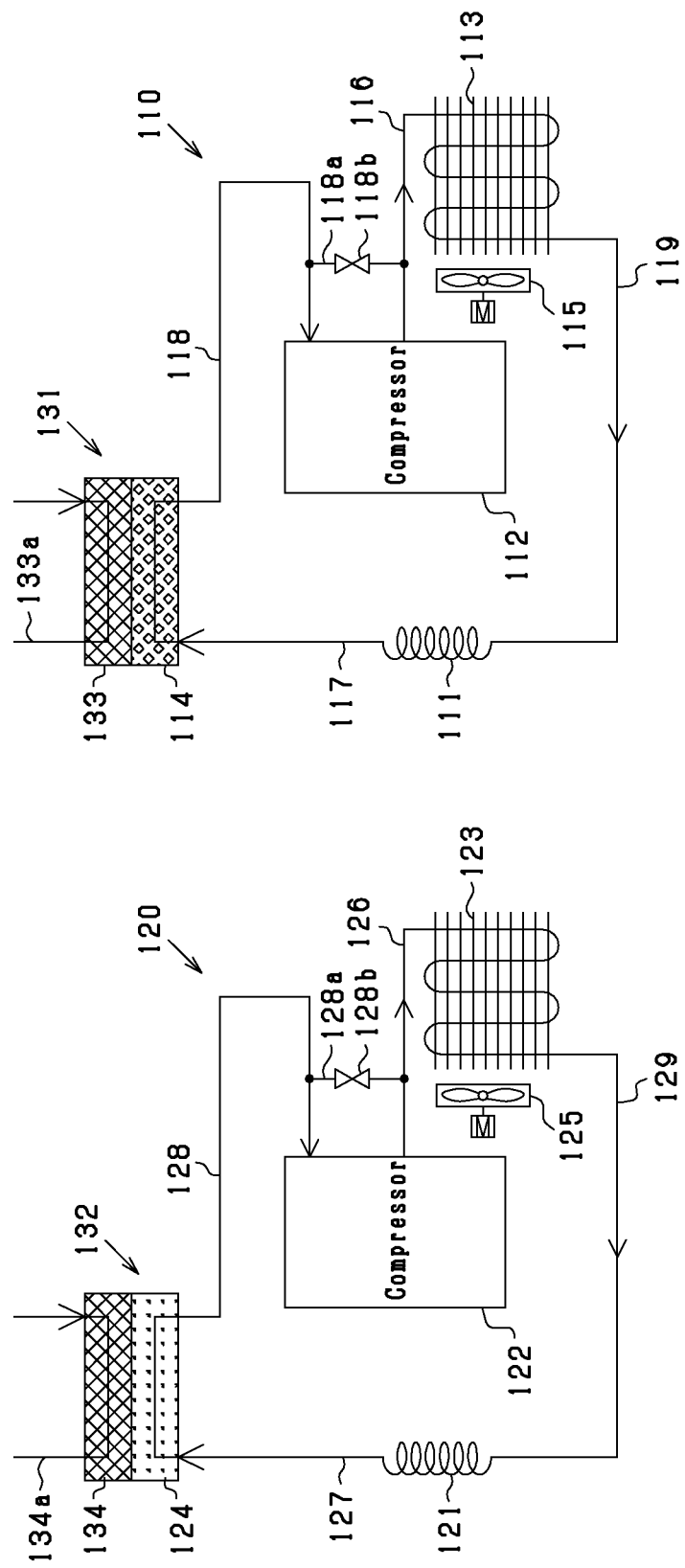
FIG. 2 is a schematic diagram showing a modification of a first circulation circuit and a second circulation circuit.

As shown in FIG. 2, the first circulation circuit 110 may include a bypass flow passage 118a which causes the evaporated first heat transfer medium to flow from the flow passage 118 to the first condenser 113 while bypassing the first compressor 112, and an on-off valve 118b for opening and closing the bypass flow passage 118a. The control section 80 may stop the first compressor 112 when the on-off valve 118b is opened. Similarly, the second circulation circuit 120 may include a bypass flow passage 128a and an on-off valve 128b. The control section 80 may stop the second compressor 122 when the on-off valve 128b is opened.

The above-described configuration allows the following operations. By closing the on-off valve 118b, the evaporated first heat transfer medium can be caused to flow to the first compressor 112 through the flow passage 118 without flowing through the bypass flow passage 118a. Meanwhile, by opening the on-off valve 118b, the evaporated first heat transfer medium can be caused to flow from the flow passage 118 to the first condenser 113 through the bypass flow passage 118a while bypassing the first compressor 112. When the on-off valve 118b is opened, the control section 80 stops the first compressor 112. Therefore, in the case where the amount of thermal energy which must be supplied to the first flow-through section 114 is small, the consumption energy of the temperature control system 200 can be reduced by stopping the first compressor 112. The second circulation circuit 120 can achieve the same action and effect. Notably, in place of the on-off valve 118b (128b), a switching valve for switching the flow state of the first heat transfer medium (the second heat transfer medium) between a state in which the first heat transfer medium (the second heat transfer medium) flows to the first compressor 112 (the second compressor 122) and a state in which the first heat transfer medium (the second heat transfer medium) flows to the first condenser 113 (the second condenser 123) may be provided.

In place of the first fan 115 and the second fan 125, a configuration for cooling the first condenser 113 and the second condenser 123 by using cooling water may be provided.

Second Embodiment

Figure 3:
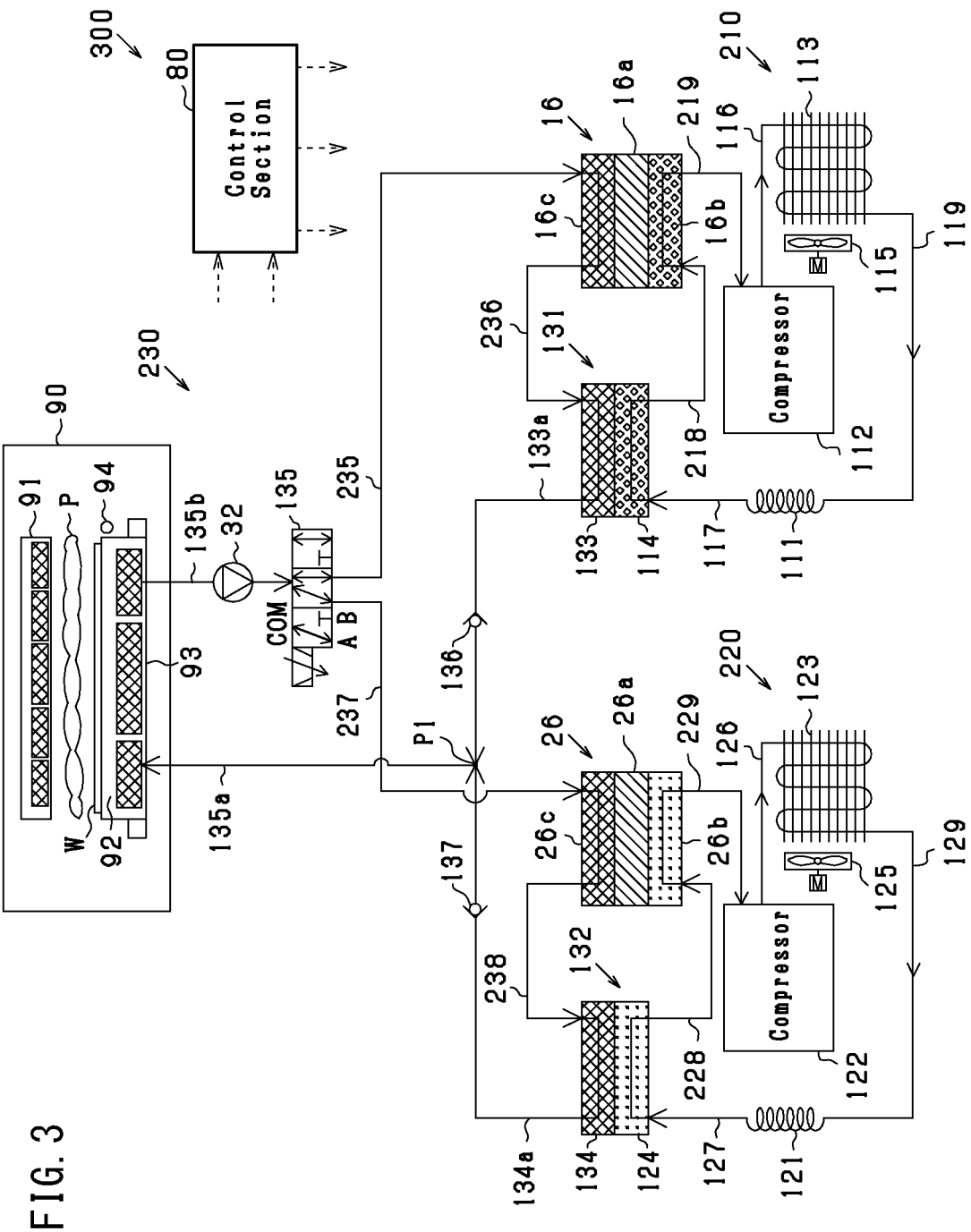
FIG. 3 is a schematic diagram of a temperature control system according to a second embodiment.

As shown in FIG. 3, a temperature control system 300 of the second embodiment of the present invention is obtained by adding a first heat storage unit 16 (first heat storage section) and a second heat storage unit 26 (second heat storage section) to the temperature control system 200 of the first embodiment.

A first circulation circuit 210 is a circuit through which the above-described first heat transfer medium circulates. A second circulation circuit 220 is a circuit which is independent of the first circulation circuit 210 and through which the above-described second heat transfer medium circulates. A third circulation circuit 230 is a circuit which is independent of the first circulation circuit 210 and the second circulation circuit 220 and through which the above-described third heat transfer medium circulates.

The first circulation circuit 210 includes the first expansion section 111, the first flow-through section 114, the first compressor 112, the first condenser 113, the first fan 115, a first heat storage flow-through section 16b, etc.

The first flow-through section 114 and the first heat storage flow-through section 16b are connected to each other by a flow passage 218. The first heat storage flow-through section 16b and the first compressor 112 are connected to each other by a flow passage 219. Notably, the flow passages 117 and 218 form a first supply path. The flow passage 219 forms a first return path.

The B port of the third distribution valve 135 and a first heat radiation flow-through section 16c are connected to each other by a flow passage 235. The first heat radiation flow-through section 16c and the third flow-through section 133 are connected to each other by a flow passage 236. The first heat radiation flow-through section 16c is provided inside the first heat storage unit 16, and the third heat transfer medium flows through the first heat radiation flow-through section 16c. Notably, the flow passages 235 and 236 form a first intermediary return path.

When the first heat transfer medium having a temperature lower than −10° C. flows through the first heat storage flow-through section 16b, a first heat storage material 16a changes its state to solid at −10° C. (third temperature), thereby storing latent heat as thermal energy. When the third heat transfer medium having a temperature higher than −10° C. flows through the first heat radiation flow-through section 16c, the latent heat (thermal energy) stored in the first heat storage material 16a is used for cooling of the third heat transfer medium.

The second circulation circuit 220 includes the second expansion section 121, the second flow-through section 124, the second compressor 122, the second condenser 123, the second fan 125, a second heat storage flow-through section 26b, etc.

The second flow-through section 124 and the second heat storage flow-through section 26b are connected to each other by a flow passage 228. The second heat storage flow-through section 26b and the second compressor 122 are connected to each other by a flow passage 229. Notably, the flow passages 127 and 228 form a second supply path. The flow passage 229 forms a second return path.

The A port of the third distribution valve 135 and a second heat radiation flow-through section 26c are connected to each other by a flow passage 237. The second heat radiation flow-through section 26c and the fourth flow-through section 134 are connected to each other by a flow passage 238. The second heat radiation flow-through section 26c is provided inside the second heat storage unit 26, and the third heat transfer medium flows through the second heat radiation flow-through section 26c. Notably, the flow passages 237 and 238 form a second intermediary return path. The flow passages 135b, 235, 236, 237, and 238 form a third return path.

When the second heat transfer medium having a temperature lower than 100° C. flows through the second heat storage flow-through section 26b, a second heat storage material 26a changes its state to solid at 100° C. (fourth temperature, thereby storing latent heat as thermal energy. When the third heat transfer medium having a temperature higher than 100° C. flows through the second heat radiation flow-through section 26c, the latent heat (thermal energy) stored in the second heat storage material 26a is used for cooling of the third heat transfer medium.

The second embodiment of the present invention having been described in detail above has the following advantages.

Notably, only the advantages different from those of the second embodiment will be described.

The first heat storage unit 16 stores thermal energy when the first heat transfer medium flows therethrough and the first heat storage material 16a changes its state at −10° C. Therefore, thermal energy can be stored in the first heat storage unit 16 for preparation for, for example, changing the temperature of the lower electrode 92. Also, the second circulation circuit 220 achieves the same action and effect as those of the first circulation circuit 210, by its configuration similar to that of the first circulation circuit 210.

When the third flow-through section 133 receives thermal energy from the first flow-through section 114, the thermal energy stored in the first heat storage unit 16 can also be used. Similarly, when the fourth flow-through section 134 receives thermal energy from the second flow-through section 124, the thermal energy stored in the second heat storage unit 26 can also be used. Therefore, the thermal energies supplied to the third flow-through section 133 and the fourth flow-through section 134 can be increased, and the temperature of the third heat transfer medium can be changed quickly. Accordingly, responsiveness in controlling the temperature of the lower electrode 92 can be enhanced further.

The third circulation circuit 230 includes the flow passages 235 and 236 through which the third heat transfer medium flows from the heat exchanger 93 to the third flow-through section 133 through the first heat storage unit 16. Therefore, when the third heat transfer medium is caused to flow from the heat exchanger 93 to the third flow-through section 133, thermal energy can be supplied directly to the third heat transfer medium from the first heat storage unit 16. Similarly, when the third heat transfer medium is caused to flow from the heat exchanger 93 to the fourth flow-through section 134, thermal energy can be supplied directly to the third heat transfer medium from the second heat storage unit 26. Accordingly, responsiveness in controlling the temperature of the lower electrode 92 can be enhanced further.

Third Embodiment

A third embodiment will now be described. In the following description, the difference between the third embodiment and the second embodiment will be mainly described. Notably, portions identical with those of the first and second embodiments are denoted by the same reference numerals, and their description will not be repeated.

Figure 4:
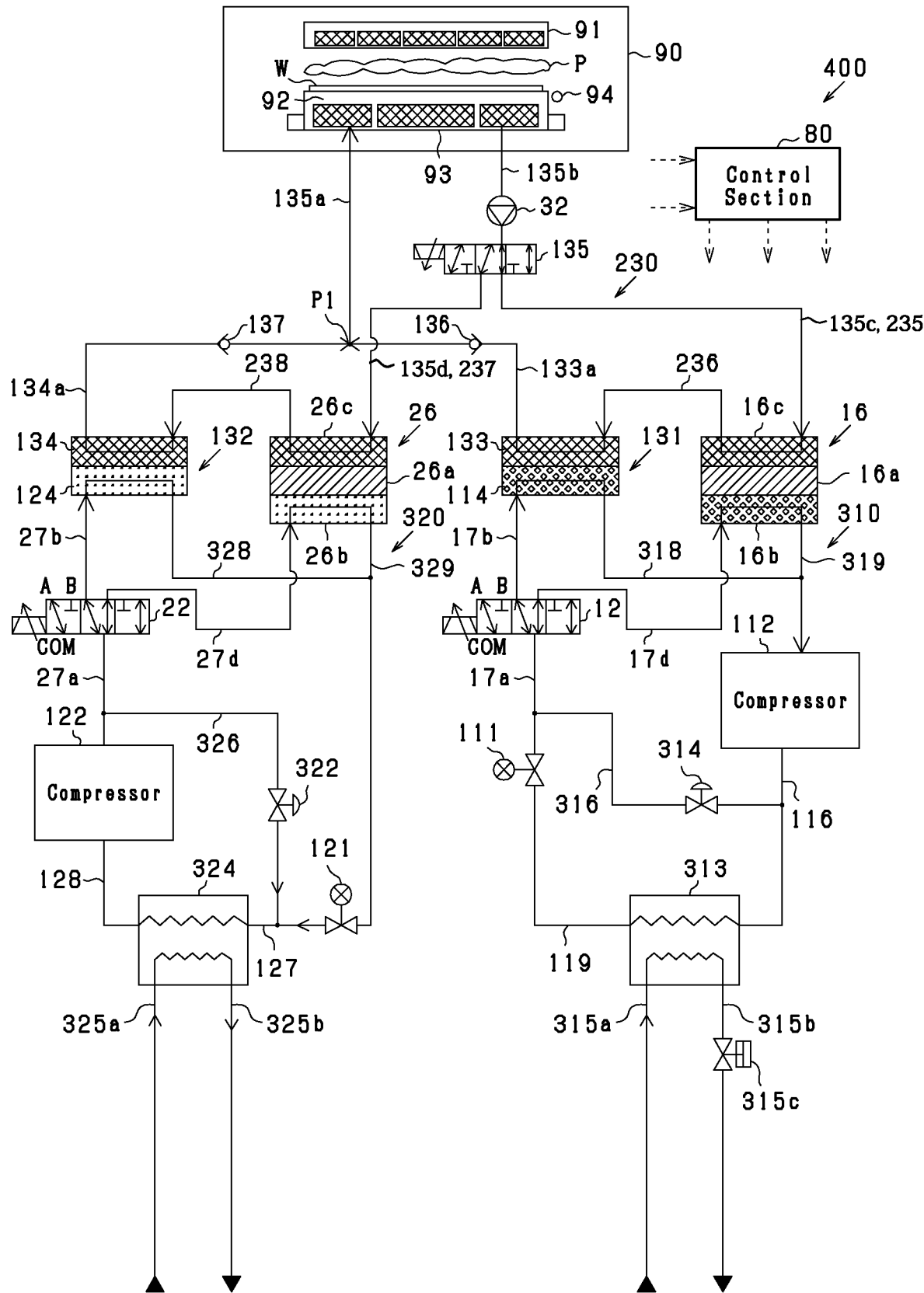
FIG. 4 is a schematic diagram of a temperature control system according to a third embodiment.

As shown in FIG. 4, a temperature control system 400 of the third embodiment of the present invention is obtained by adding a first distribution valve 12 and a second distribution valve 22 to the temperature control system 300 of the second embodiment. Also, the temperature control system 400 includes a second circulation circuit 320 for heating the second flow-through section 124, instead of the second circulation circuit 120 for cooling the second flow-through section 124.

A first circulation circuit 310 is a circuit through which the above-described first heat transfer medium circulates. The second circulation circuit 320 is a circuit which is independent of the first circulation circuit 310 and through which the above-described second heat transfer medium circulates. The third circulation circuit 230 is a circuit which is independent of the first circulation circuit 310 and the second circulation circuit 320 and through which the above-described third heat transfer medium circulates.

The first compressor 112 and a first condenser 313 are connected to each other by the flow passage 116. A water passage 315a is connected to the inlet port of the first condenser 313. Cooling water of a first water temperature (e.g., 30° C.) is supplied from the water passage 315a into the first condenser 313. A water passage 315b is connected to the outlet port of the first condenser 313. A water regulating valve 315c is provided in the water passage 315b. The water regulating valve 315c controls the flow rate of the cooling water flowing through the water passage 315b.

The first condenser 313 (first condensation section) condenses the gas-state first heat transfer medium compressed by the first compressor 112 and supplies the condensed first heat transfer medium to the above-described first expansion section 111. At that time, the first heat transfer medium flowing through the first condenser 113 is cooled by water. The first condenser 313 and the above-described first expansion section 111 are connected to each other by the above-described flow passage 119.

Since the first compressor 112 is designed to compress the first heat transfer medium in gas state, if the first compressor 112 compresses the first heat transfer medium in liquid state, the first compressor 112 may break. In the case where the amount of heat exchanged between the first flow-through section 114 and the third flow-through section 133 is small, the first heat transfer medium having flowed through the first flow-through section 114 does not evaporate sufficiently, and the first heat transfer medium in liquid state may be supplied to the first compressor 112. Also, in the case where the amount of heat exchanged between the first heat storage flow-through section 16b and the first heat storage material 16a is small, the first heat transfer medium having flowed through the first heat storage flow-through section 16b does not evaporate sufficiently, and the first heat transfer medium in liquid state may be supplied to the first compressor 112.

In view of the foregoing, the first circulation circuit 310 includes a connection flow passage 316 which establishes communication between the flow passage 17a and the passage between the first compressor 112 and the first condenser 313 (specifically, the flow passage 116) and through which the gas-state first heat transfer medium compressed by the first compressor 112 flows to the flow passage 17a, and an on-off valve 314 which opens and closes the connection flow passage 316.

The flow passage 17a is connected to the common port (COM) of the first distribution valve 12. The first distribution valve 12 (adjustment section) is a three-way valve having the common port, an A port, and a B port. A flow passage 17b is connected to the A port. A flow passage 17d is connected to the B port.

The first distribution valve 12 continuously changes the ratio between the flow rate of the first heat transfer medium flowing from the flow passage 17a to the flow passage 17b and the flow rate of the first heat transfer medium flowing from the flow passage 17a to the flow passage 17d. The first distribution valve 12 continuously changes the state of flow between a state in which all (100%) of the first heat transfer medium flows from the flow passage 17a to the flow passage 17b and a state in which all (100%) of the first heat transfer medium flows from the flow passage 17a to the flow passage 17d. Namely, the first distribution valve 12 changes the ratio at which the first heat transfer medium supplied from the first expansion section 111 through the flow passage 17a is distributed between the first flow-through section 114 and the first heat storage flow-through section 16b of the first heat storage unit 16. In the first distribution valve 12, the pressure loss of the first heat transfer medium is constant irrespective of the ratio at which the first heat transfer medium supplied from the first expansion section 111 is distributed between the first flow-through section 114 and the first heat storage flow-through section 16b of the first heat storage unit 16.

The first heat storage flow-through section 16b and the first compressor 112 are connected to each other by a flow passage 319. The first flow-through section 114 and the flow passage 319 are connected to each other by a flow passage 318. Notably, the flow passages 17a, 17b, and 17d form a first supply path. The flow passages 318 and 319 form a first return path.

The second expansion section 121 and an evaporator 324 are connected to each other by the flow passage 127. A water passage 325a is connected to the inlet port of the evaporator 324. Cooling water of a second water temperature (e.g., 60° C.) higher than the above-described first water temperature is supplied from the water passage 325a into the evaporator 324. A water passage 325b is connected to the outlet port of the evaporator 324.

The evaporator 324 (evaporation section) evaporates the second heat transfer medium expanded and atomized by the second expansion section 121 and supplies the evaporated second heat transfer medium to the above-described second compressor 122. At that time, the second heat transfer medium flowing through the evaporator 324 is heated by the cooling water of the second water temperature. The evaporator 324 and the above-described second compressor 122 are connected to each other by the flow passage 128.

Since the second compressor 122 is designed to compress the second heat transfer medium in gas state, if the second compressor 122 compresses the second heat transfer medium in liquid state, the second compressor 122 may break. In the case where the second heat transfer medium does not evaporate sufficiently in the evaporator 324, the second heat transfer medium in liquid state may be supplied to the second compressor 122.

In view of the foregoing, the second circulation circuit 320 includes a connection flow passage 326 which establishes communication between the flow passage 127 and the passage between the second compressor 122 and the second distribution valve 22 (specifically, the flow passage 27a) and through which the gas-state second heat transfer medium compressed by the second compressor 122 flows to the flow passage 127, and an on-off valve 322 which opens and closes the connection flow passage 326.

The flow passage 27a is connected to the common port (COM) of the second distribution valve 22. The second distribution valve 22 (adjustment section) is a three-way valve having the common port, an A port, and a B port. A flow passage 27b is connected to the A port. A flow passage 27d is connected to the B port.

The second distribution valve 22 continuously changes the ratio between the flow rate of the second heat transfer medium flowing from the flow passage 27a to the flow passage 27b and the flow rate of the second heat transfer medium flowing from the flow passage 27a to the flow passage 27d. The second distribution valve 22 continuously changes the state of flow between a state in which all (100%) of the second heat transfer medium flows from the flow passage 27a to the flow passage 27b and a state in which all (100%) of the second heat transfer medium flows from the flow passage 27a to the flow passage 27d. Namely, the second distribution valve 22 changes the ratio at which the second heat transfer medium supplied from the second compressor 122 through the flow passage 27a is distributed between the second flow-through section 124 and the second heat storage flow-through section 26b of the second heat storage unit 26. In the second distribution valve 22, the pressure loss of the second heat transfer medium is constant irrespective of the ratio at which the second heat transfer medium supplied from the second compressor 122 is distributed between the second flow-through section 124 and the second heat storage flow-through section 26b of the second heat storage unit 26.

The second heat storage flow-through section 26b and the second expansion section 121 are connected to each other by a flow passage 329. The second flow-through section 124 and the flow passage 329 are connected to each other by a flow passage 328. Notably, the flow passages 27a, 27b, and 27d form a second supply path. The flow passages 328 and 329 form a second return path.

In the case where the control section 80 controls the first distribution valve 12 such that the first heat transfer medium atomized by the first expansion section 111 flows to the first flow-through section 114, the control section 80 controls the second distribution valve 22 such that the second heat transfer medium supplied from the second compressor 122 flows to the second heat storage unit 26. Meanwhile, In the case where the control section 80 controls the second distribution valve 22 such that the second heat transfer medium compressed by the second compressor 122 flows to the second flow-through section 124, the control section 80 controls the first distribution valve 12 such that the first heat transfer medium supplied from the first expansion section 111 flows to the first heat storage unit 16. Also, in the case where the control section 80 controls the third distribution valve 135 so as to prevent the third heat transfer medium from flowing from the heat exchanger 93 to the third flow-through section 133, the control section 80 controls the first distribution valve 12 such that the first heat transfer medium supplied from the first expansion section 111 flows to the first heat storage unit 16. Meanwhile, in the case where the control section 80 controls the third distribution valve 135 so as to prevent the third heat transfer medium from flowing from the heat exchanger 93 to the fourth flow-through section 134, the control section 80 controls the second distribution valve 22 such that the second heat transfer medium supplied from the second compressor 122 flows to the second heat storage unit 26.

The third embodiment of the present invention having been described in detail above has the following advantages. Notably, only the advantages different from those of the first and second embodiments will be described.

The first circulation circuit 310 includes the first distribution valve 12 which changes the ratio at which the first heat transfer medium atomized by the first expansion section 111 is distributed between the first flow-through section 114 and the first heat storage unit 16. Therefore, the ratio between the thermal energy supplied from the first expansion section 111 to the first flow-through section 114 and the thermal energy supplied from the first expansion section 111 to the first heat storage unit 16 can be changed by the first distribution valve 12. Accordingly, it is possible to change the ratio between the thermal energy used for heat exchange between the first flow-through section 114 and the third flow-through sections 133 and the thermal energy stored in the first heat storage unit 16. Similarly, it is possible to change the ratio between the thermal energy used for heat exchange between the second flow-through sections 124 and the fourth flow-through sections 134 and the thermal energy stored in the second heat storage unit 26.

The temperature control system 400 includes the control section 80 for controlling the first distribution valve 12 and the second distribution valve 22. In the case where the control section 80 controls the first distribution valve 12 such that the first heat transfer medium atomized by the first expansion section 111 flows to the first flow-through section 114, the control section 80 controls the second distribution valve 22 such that the second heat transfer medium supplied from the second compressor 122 flows to the second heat storage unit 26. Therefore, in the case where the first heat transfer medium atomized by the first expansion section 111 is caused to flow to the first flow-through section 114; namely, in the case where the necessity of heat exchange between the second flow-through sections 124 and the fourth flow-through sections 124 is small, thermal energy can be stored in the second heat storage unit 26. Meanwhile, in the case where the second heat transfer medium supplied from the second compressor 122 is caused to flow through the second flow-through sections 124; namely, in the case where the necessity of heat exchange between the first flow-through section 114 and the third flow-through sections 133 is small, thermal energy can be stored in the first heat storage unit 16.

The temperature control system 400 includes the control section 80 which controls the first distribution valve 12, the second distribution valve 22, and the third distribution valve 135. In the case where the control section 80 controls the third distribution valve 135 so as to prevent the flow of the third heat transfer medium from the heat exchanger 93 to the third flow-through section 133, the control section 80 controls the first distribution valve 12 such that the first heat transfer medium supplied from the first expansion section 111 flows to the first heat storage unit 16. Therefore, in the case where the third heat transfer medium is not caused to flow from the heat exchanger 93 to the third flow-through section 133; i.e., in the case where heat exchange between the first flow-through section 114 and the third flow-through section 133 is unnecessary, thermal energy can be stored in the first heat storage unit 16. Meanwhile, in the case where the third heat transfer medium is not caused to flow from the heat exchanger 93 to the fourth flow-through section 134; i.e., in the case where heat exchange between the second flow-through section 124 and the fourth flow-through section 134 is unnecessary, thermal energy can be stored in the second heat storage unit 26.

The first circulation circuit 310 includes the connection flow passage 316 which establishes communication between the flow passage 17a and the flow passage 116 between the first compressor 112 and the first condenser 313 and through which the gas-state first heat transfer medium compressed by the first compressor 112 flows to the flow passage 17a, and the on-off valve 314 which opens and closes the connection flow passage 316. By virtue of such a configuration, by opening the on-off valve 314, the gas-state first heat transfer medium compressed by the first compressor 112 and having an increased temperature can be caused to flow to the flow passage 17a through the connection flow passage 316. Therefore, even in the case where the amount of heat exchanged between the first flow-through section 114 and the third flow-through section 133 is small, the first heat transfer medium having flowed through the first flow-through section 114 can be evaporated sufficiently, whereby the liquid-state first heat transfer medium can be prevented from being supplied to the first compressor 112.

The second circulation circuit 320 includes the connection flow passage 326 which establishes communication between the flow passage 27a and the flow passage 127 between the second expansion section 121 and the evaporator 324 and through which the gas-state second heat transfer medium compressed by the second compressor 122 flows to the flow passage 127, and the on-off valve 322 which opens and closes the connection flow passage 326. By virtue of such a configuration, by opening the on-off valve 322, the gas-state second heat transfer medium compressed by the second compressor 122 and having an increased temperature can be caused to flow to the flow passage 127 through the connection flow passage 326. Therefore, the second heat transfer medium having flowed through the evaporator 324 can be evaporated sufficiently, whereby the liquid-state second heat transfer medium can be prevented from being supplied to the second compressor 122.

The second circulation circuit 320 includes the second compressor 122 which compresses the gas-state second heat transfer medium and supplies the compressed second heat transfer medium to the flow passage 27a. Therefore, the gas-state second heat transfer medium can be caused to flow to the second flow-through section 124 through the flow passages 27a and 27b. The second flow-through section 124 is caused to function as a condenser so as to condense the second heat transfer medium in the second flow-through section 124, whereby thermal energy can be supplied to the second flow-through section 124 (specifically, the second flow-through section 124 can be heated).

The second circulation circuit 320 includes the second expansion section 121 to which the second heat transfer medium having flowed through the second flow-through section 124 and become liquid is supplied through the flow passage 329 and which expends and atomizes the liquid-state second heat transfer medium, and the evaporator 324 which evaporates the second heat transfer medium atomized by the second expansion section 121 and supplies the evaporated second heat transfer medium to the second compressor 122. Therefore, the second heat transfer medium having flowed through the second flow-through section 124 and become liquid is evaporated, whereby the gas-state second heat transfer medium can be supplied to the second compressor 122.

The first condenser 313 condenses the first heat transfer medium through heat exchange between the first heat transfer medium and the cooling water of the first water temperature, and the evaporator 324 evaporates the second heat transfer medium through heat exchange between the second heat transfer medium and the cooling water of the second water temperature higher than the first water temperature. By virtue of such a configuration, in the case where a plurality of cooling water sources which supply cooling water at different temperatures are available, it is possible to use cooling water of the first water temperature for the first condenser 313 and use cooling water of the second water temperature higher than the first water temperature for the evaporator 324. Accordingly, the consumption energy of the temperature control system 400 can be reduced by effectively utilizing the plurality of cooling water sources which supply cooling water at different temperatures.

Notably, the third embodiment may be modified as follows. Portions identical with those of the third embodiment are denoted by the same reference numerals, and their description will not be repeated.

In the case where the control section 80 controls the third distribution valve 135 such that the third heat transfer medium flows from the heat exchanger 93 to the third flow-through section 133, the control section 80 may control the first distribution valve 12 such that the first heat transfer medium supplied from the first expansion section 111 flows to the first heat storage unit 16. In the case where the control section 80 controls the third distribution valve 135 such that the third heat transfer medium flows from the heat exchanger 93 to the fourth flow-through section 134, the control section 80 may control the second distribution valve 22 such that the second heat transfer medium supplied from the second compressor 122 flows to the second heat storage unit 26.

Figure 5:
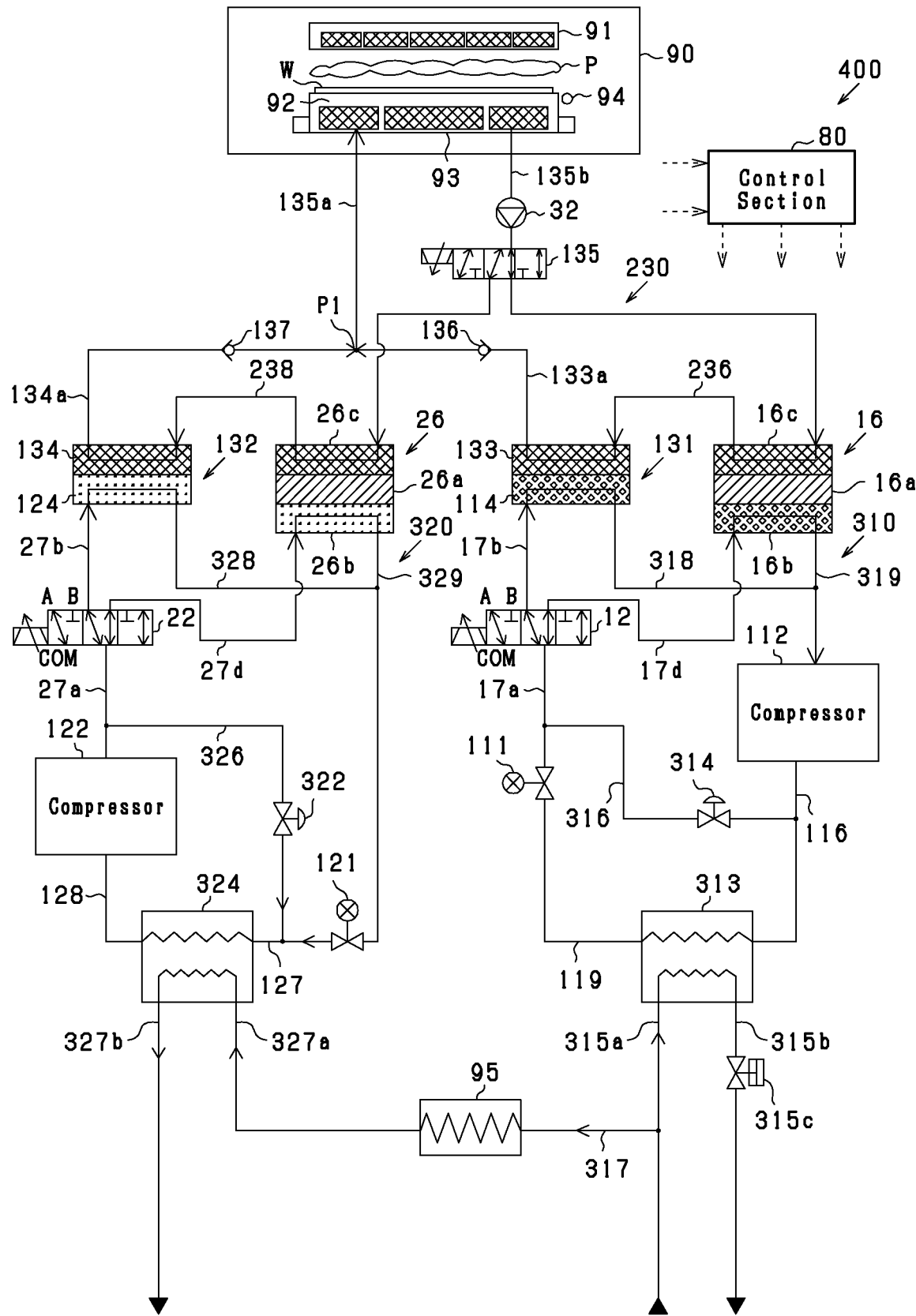
FIG. 5 is a schematic diagram showing a modification of a water path.

As shown in FIG. 5, the cooling water of the second water temperature may be cooling water obtained as a result of the cooling water of the first water temperature being heated when used for cooling of a predetermined member 95. The predetermined member 95 may be a member (e.g., a heating furnace) provided in a plant together with the semiconductor manufacturing apparatus 90 or a member for cooling the chamber of the semiconductor manufacturing apparatus 90. The above-described water passage 315*a* and the predetermined member 95 are connected to each other by a water passage 317. The predetermined member 95 and the evaporator 324 are connected to each other by a water passage 327*a*. A water passage 327*b* is connected to the outlet port of the evaporator 324.

According to the above-described configuration, cooling water whose temperature has risen from the first water temperature to the second water temperature as a result of being used for cooling of the predetermined member 95 can be effectively used as the cooling water of the second water temperature. Therefore, even in the case where only the cooling water of the first water temperature is supplied in a plant or the like, the cooling water of the second water temperature can be supplied to the temperature control system 400.

Figure 6:
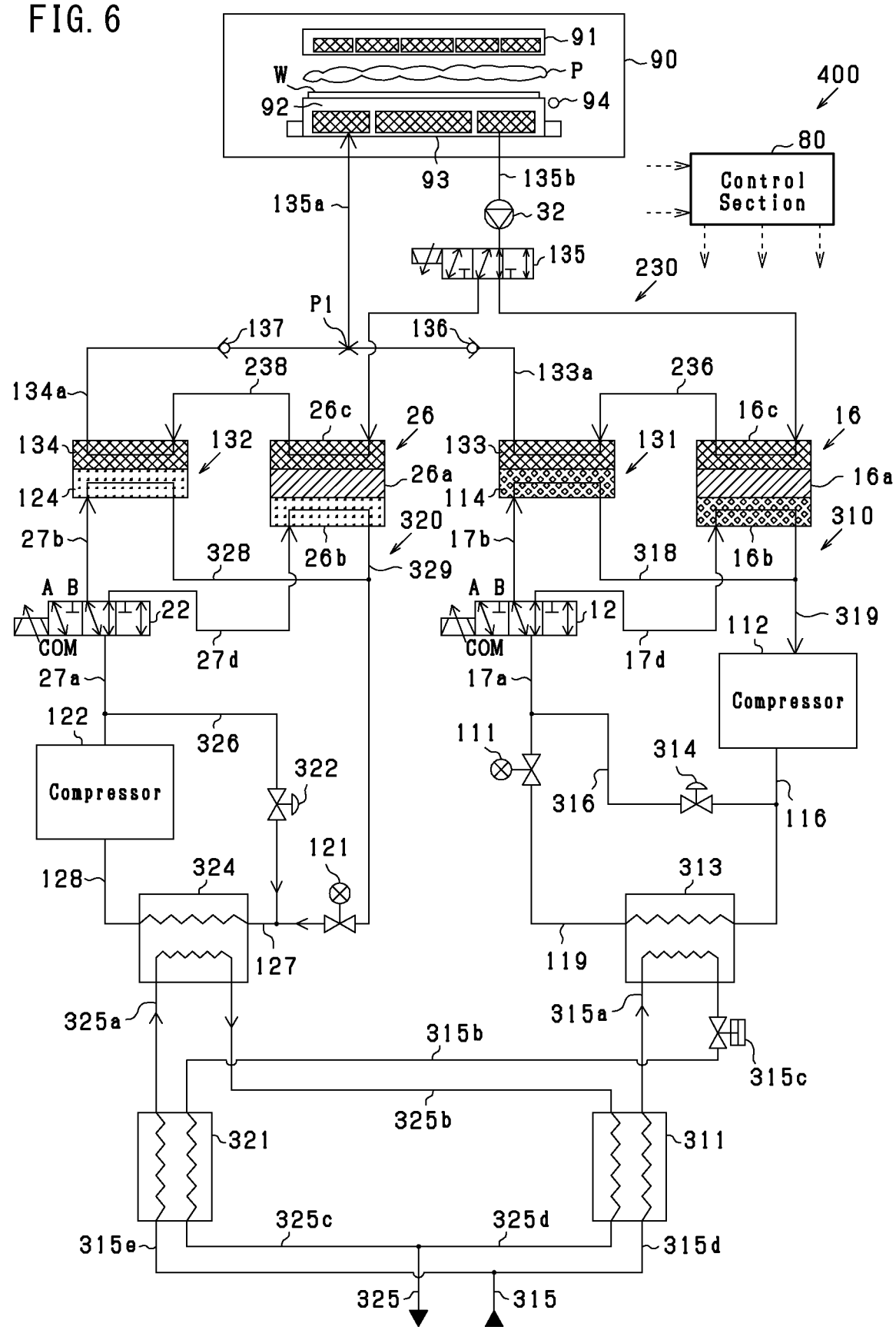
FIG. 6 is a schematic diagram showing another modification of the water path.

As shown in FIG. 6, the temperature control system 400 may include a pre-cooler 311 which cools the cooling water supplied to the first condenser 313 by using the cooling water having flowed through the evaporator 324, and a pre-heater 321 which heats the cooling water supplied to the evaporator 324 by using the cooling water having flowed through the first condenser 313. Specifically, the first condenser 313 and the pre-cooler 311 are connected to each other by a water passage 315*a*. The pre-cooler 311 and a water passage 315 are connected to each other by a water passage 315*d*. The water passage 315 and the pre-heater 321 are connected to each other by a water passage 315*e*. The water regulating valve 315*c* and the pre-heater 321 are connected to each other by a water passage 315*b*. The pre-heater 321 and a water passage 325 are connected to each other by a water passage 325*c*. The pre-cooler 311 and the water passage 325 are connected to each other by a water passage 325*d*. The cooling water of the first temperature (for example, 30° C.) is supplied from the water passage 315, and the cooling water after circulation is discharged from the water passage 325.

According to the above-described configuration, the first condenser 313 condenses the first heat transfer medium through heat exchange between cooling water and the first heat transfer medium. Therefore, cooling water of low temperature is needed in the first condenser 313, and the temperature of the cooling water rises (for example, to 35° C.) as a result of flow through the first condenser 313. The evaporator 324 evaporates the second heat transfer medium through heat exchange between cooling water and the second heat transfer medium. Therefore, cooling water of high temperature is needed in the evaporator 324, and the temperature of the cooling water drops (for example, to 25° C.) as a result of flow through the evaporator 324.

The temperature control system 400 includes the pre-cooler 311 which cools the cooling water supplied to the first condenser 313 by using the cooling water having flowed through the evaporator 324. Therefore, the cooling water having flowed through the evaporator 324 and having a decreased temperature can be used effectively for cooling the cooling water supplied to the first condenser 313. Also, the temperature control system 400 includes the pre-heater 321 which heats the cooling water supplied to the evaporator 324 by using the cooling water having flowed through the first condenser 313. Therefore, the cooling water having flowed through the first condenser 313 and having an increased temperature can be used effectively for heating the cooling water supplied to the evaporator 324. Accordingly, the consumption energy of the temperature control system 400 can be reduced.

Fourth Embodiment

A fourth embodiment will now be described. In the following description, the difference between the fourth embodiment and the third embodiment will be mainly described. Notably, portions identical with those of the first through third embodiments are denoted by the same reference numerals, and their description will not be repeated.

Figure 7:
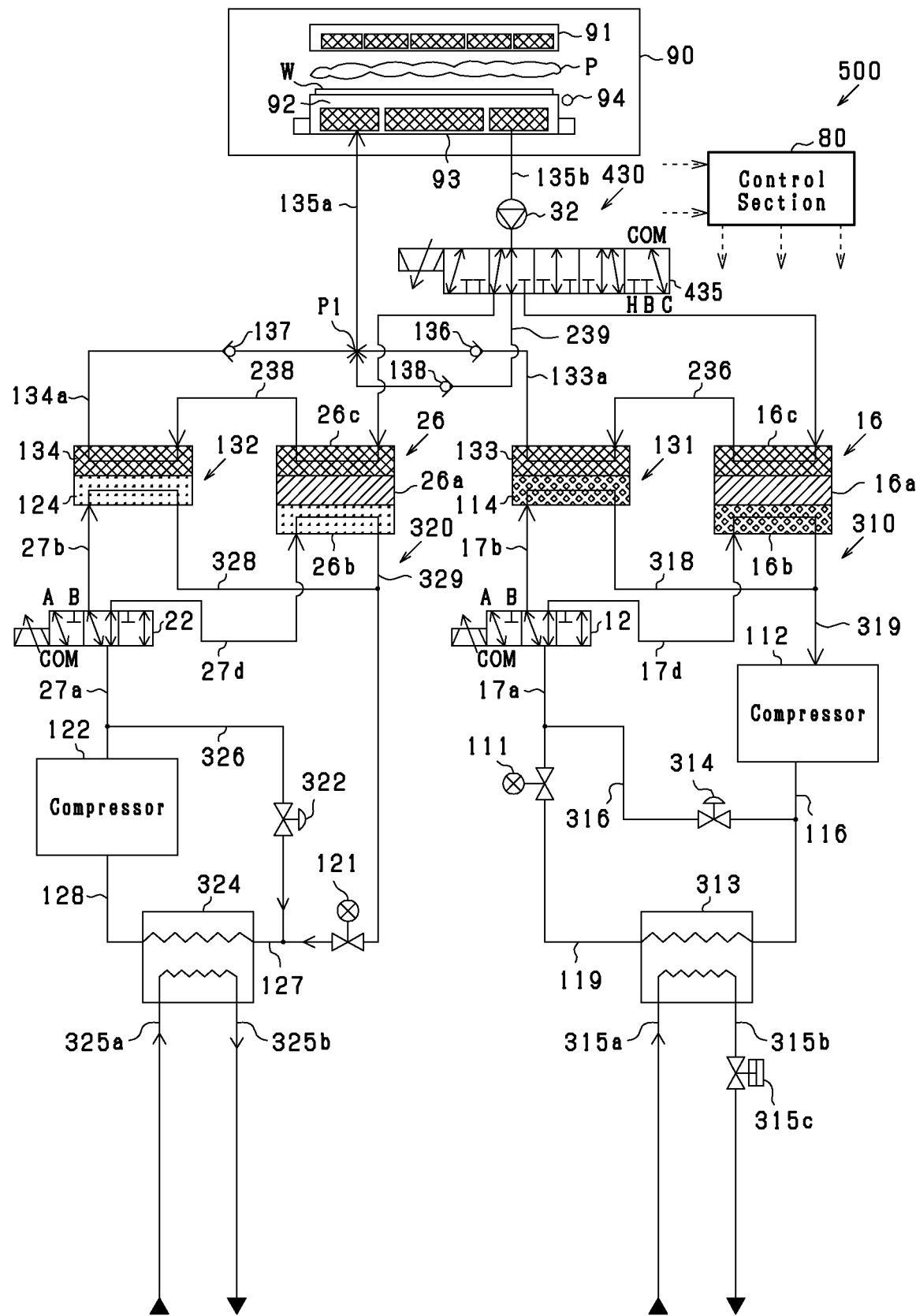
FIG. 7 is a schematic diagram of a temperature control system according to a fourth embodiment.

As shown in FIG. 7, a temperature control system 500 of the fourth embodiment of the present invention is identical with the temperature control system 400 of the third embodiment except that the third distribution valve 135 is replaced with a fourth distribution valve 435.

The fourth distribution valve 435 (adjustment section) is a four-way valve having a common port, an H port, a B port, and a C port. The flow passage 235 is connected to the C port. The flow passage 235 is connected to the first heat radiation flow-through section 16*c* of the first heat storage unit 16. A flow passage 239 is connected to the B port. The flow passage 239 is connected to the flow passage 135*a* at the merging point P1. A third check valve 138 is provided in the flow passage 239. The third check valve 138 permits the third heat transfer medium to flow from the fourth distribution valve 435 to the merging point P1 and prohibits the third heat transfer medium from flowing from the merging point P1 to the fourth distribution valve 435. The flow passage 237 is connected to the H port. The flow passage 237 is connected to the second heat radiation flow-through section 26*c* of the second heat storage unit 26.

The fourth distribution valve 435 continuously changes the ratio among the flow rate of the third heat transfer medium flowing from the flow passage 135*b* to the flow passage 235, the flow rate of the third heat transfer medium flowing from the flow passage 135*b* to the flow passage 239, and the flow rate of the third heat transfer medium flowing from the flow passage 135*b* to the flow passage 237. Namely, the fourth distribution valve 435 changes the ratio among the third heat transfer medium flowing from the heat exchanger 93 to the first heat radiation flow-through section 16*c* and the third flow-through section 133, the third heat transfer medium flowing out of the heat exchanger 93 and returning to the heat exchanger 93 without flowing through the third flow-through section 133 and the fourth flow-through section 134, and the third heat transfer medium flowing from the heat exchanger 93 to the second heat radiation flow-through section 26*c* and the fourth flow-through section 134. The fourth distribution valve 435 continuously changes the state of flow among a state in which all (100%) of the third heat transfer medium flows from the flow passage 135*b* to the flow passage 235, a state in which the third heat transfer medium flows from the flow passage 135*b* to the flow passages 235 and 239, a state in which all (100%) of the third heat transfer medium flows from the flow passage 135*b* to the flow passage 239, a state in which the third heat transfer medium flows from the flow passage 135b to the flow passages 239 and 237, and a state in which all (100%) of the third heat transfer medium flows from the flow passage 135b to the flow passage 237. In the fourth distribution valve 435, the pressure loss of the third heat transfer medium is constant irrespective of the ratio at which the third heat transfer medium supplied from the pump 32 is distributed among the flow passages 235, 239, and 237.

Since the load of the pump 32 does not change irrespective of the distribution ratio of the fourth distribution valve 435, the pump 32 is driven in a constant drive state. As a result, the pump 32 circulates the third heat transfer medium through the third circulation circuit 430. The third circulation circuit 430 does not include a tank for storing the third heat transfer medium. Notably, the flow passages 133a, 134a, and 135a form a third supply path. The flow passages 135b, 235, 236, 237, and 238 form a third return path.

The control section 80 controls the temperature of the lower electrode 92 to the set temperature. The control section 80 controls the distribution ratio of the fourth distribution valve 435 on the basis of the set temperature of the lower electrode 92 and the temperature detected by the temperature sensor 94.

The fourth embodiment of the present invention having been described in detail above has the following advantages. Notably, only the advantages different from those of the third embodiment will be described.

The ratio among the thermal energy that the third flow-through section 133 receives from the first flow-through section 114, the thermal energy returned to the heat exchanger 93, and the thermal energy that the fourth flow-through section 134 receives from the second flow-through section 124 can be changed by the fourth distribution valve 435. Further, it is possible to realize a state in which the third heat transfer medium flowing out of the heat exchanger 93 is returned as it is to the heat exchanger 93 without allowing the third heat transfer medium to flow from the heat exchanger 93 to the third flow-through section 133 and the fourth flow-through section 134.

Fifth Embodiment

A fifth embodiment will now be described. In the following description, the difference between the fifth embodiment and the first embodiment will be mainly described. Notably, portions identical with those of the first through fourth embodiments are denoted by the same reference numerals, and their description will not be repeated.

As shown in FIG. 8, a temperature control system 600 of the fifth embodiment of the present invention is identical with the temperature control system 200 of the first embodiment except that the second circulation circuit 120 is replaced with a second circulation circuit 20.

The first circulation circuit 110 is a circuit through which the above-described first heat transfer medium circulates. The second circulation circuit 20 is a circuit which is independent of the first circulation circuit 110 and through which a second heat transfer medium circulates. The second heat transfer medium is, for example, a liquid composed of ethylene glycol (60%) and water (40%). The third circulation circuit 130 is a circuit which is independent of the first circulation circuit 110 and the second circulation circuit 20 and through which the above-described third heat transfer medium circulates.

The second circulation circuit 20 includes a second chiller 21, the second flow-through section 124, etc.

The second chiller 21 (second adjustment apparatus) includes a tank 21a, a pump 21b, etc. The second chiller 21 adjusts the temperature of the second heat transfer medium to 90° C. (second temperature) which is higher than the first temperature. The tank 21a (second tank) stores the second heat transfer medium adjusted to 90° C. The pump 21b discharges to a flow passage 27 the second heat transfer medium stored in the tank 21a. The flow passage 27 is connected to the second flow-through section 124. The second flow-through section 124 is provided inside the heat exchanger 132, and the second heat transfer medium flows through the second flow-through section 124.

A flow passage 28 is connected to the second flow-through section 124. The flow passage 28 is connected to the tank 21a of the second chiller 21. Notably, the flow passage 27 forms a second supply path, and the flow passage 28 forms a second return path.

The fifth embodiment of the present invention having been described in detail above has the following advantages. Notably, only the advantages different from those of the first embodiment will be described.

The second circulation circuit 20 includes the second chiller 21. The second chiller 21 supplies the second heat transfer medium of the second temperature higher than the first temperature. Therefore, the second heat transfer medium which is used for heat exchange and whose temperature is the second temperature can be supplied. The second circulation circuit 20 includes the second flow-through section 124 through which the second heat transfer medium flows, the flow passage 27 through which the second heat transfer medium supplied from the second chiller 21 flows to the second flow-through section 124, and the flow passage 28 through which the second heat transfer medium having flowed through the second flow-through section 124 flows to the second chiller 21. Therefore, thermal energy can be supplied to the second flow-through section 124 via the second heat transfer medium. Since the second heat transfer medium whose usable temperature range is narrower than that of the third heat transfer medium is used, an inexpensive heat transfer medium can be used as the second heat transfer medium.

Notably, the tank 21a of the second chiller 21 may be omitted.

Sixth Embodiment

A sixth embodiment will now be described. In the following description, the difference between the sixth embodiment and the first embodiment will be mainly described. Notably, portions identical with those of the first through fifth embodiments are denoted by the same reference numerals, and their description will not be repeated.

Figure 9:
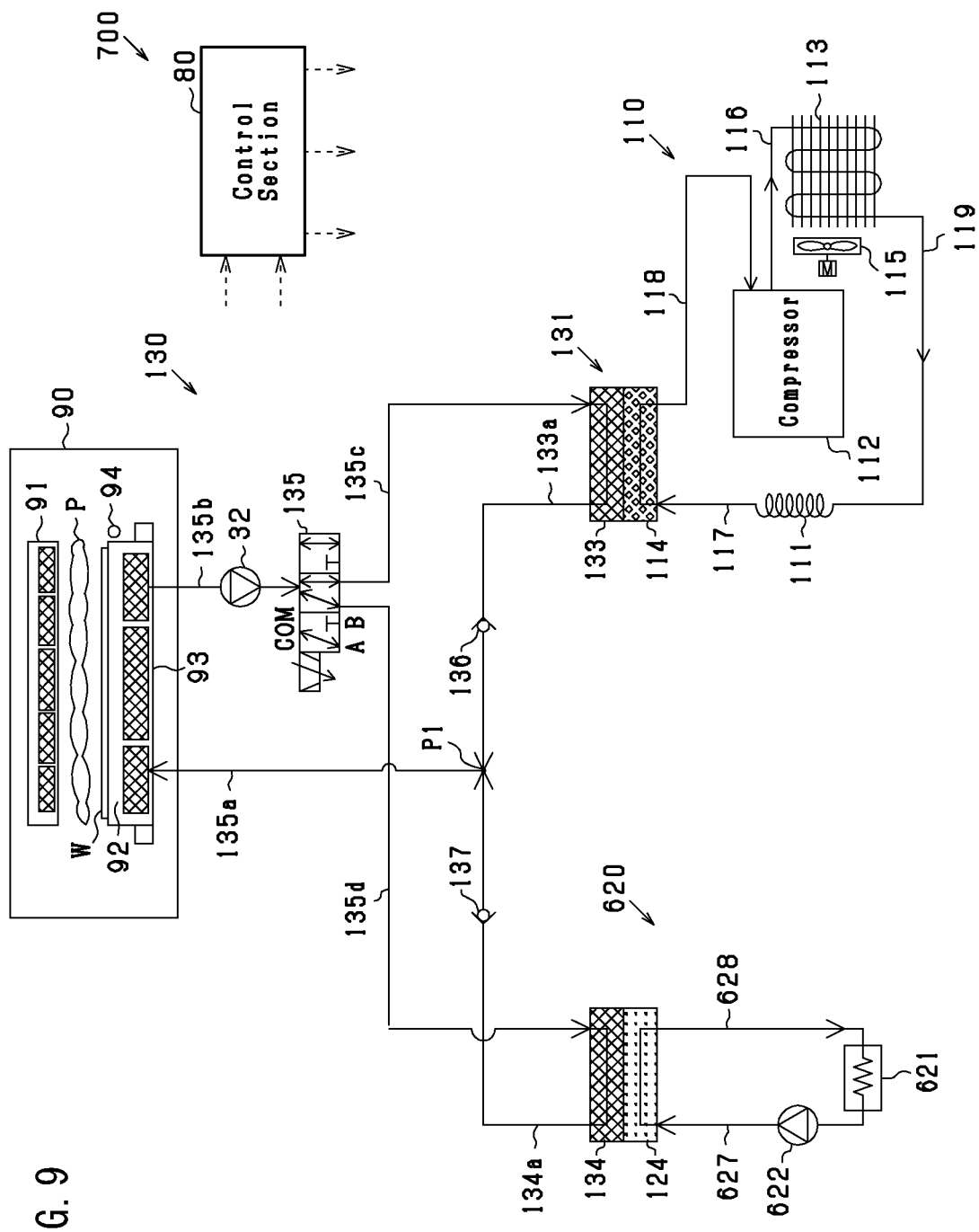
FIG. 9 is a schematic diagram of a temperature control system according to a sixth embodiment.

As shown in FIG. 9, a temperature control system 700 of the sixth embodiment of the present invention is identical with the temperature control system 200 of the first embodiment except that the second circulation circuit 120 is replaced with a second circulation circuit 620.

The first circulation circuit 110 is a circuit through which the above-described first heat transfer medium circulates. The second circulation circuit 620 is a circuit which is independent of the first circulation circuit 110 and through which a second heat transfer medium circulates. The second heat transfer medium is, for example, a liquid composed of ethylene glycol (60%) and water (40%). The second heat transfer medium is relatively inexpensive. The third circulation circuit 130 is a circuit which is independent of the first circulation circuit 110 and the second circulation circuit 620 and through which the above-described third heat transfer medium circulates.

The lowest usable temperature of the third heat transfer medium is lower than that of the second heat transfer medium. The highest usable temperature of the third heat transfer medium is higher than that of the second heat transfer medium. Namely, the usable temperature range of the third heat transfer medium is wider than that of the second heat transfer medium. Therefore, the third heat transfer medium is more expensive than the second heat transfer medium.

The second circulation circuit 620 includes a heater 621, the second flow-through section 124, etc.

The heater 621 (second adjustment apparatus) is a heater which can control the amount of heat generated. The heater 621 includes a heating wire heater, a ceramic heater, or the like (not shown) and a flow passage 621a through which the second heat transfer medium flows, and heats the second heat transfer medium flowing through the flow passage 621a. The heating state of the heater 621 is controlled by the control section 80.

The flow passage 621a of the heater 621 and the second flow-through section 124 are connected to each other by a flow passage 627. A pump 622 discharges the second heat transfer medium from the flow passage 621a of the heater 621 to the second flow-through section 124 through the flow passage 627. The second flow-through section 124 is provided inside the heat exchanger 132, and the second heat transfer medium flows through the second flow-through section 124. The second flow-through section 124 and the flow passage 621a are connected to each other by a flow passage 628. Notably, the flow passage 627 forms a second supply path, and the flow passage 628 forms a second return path.

The sixth embodiment of the present invention having been described in detail above has the following advantages. Notably, only the advantages different from those of the first embodiment will be described.

Since the second circulation circuit 620 includes the heater 621 which can control the amount of heat generated, the second heat transfer medium can be supplied with its temperature adjusted to the second temperature. In this case, in the second circulation circuit 620, the heat transfer medium heated by the heater 621 and the heat transfer medium caused to flow to the second flow-through section 124 are the same heat transfer medium; i.e. the second heat transfer medium used in common. Therefore, the configuration for heat exchange between the second heat transfer medium and the heat transfer medium which undergoes compression, atomization, and vaporization is unnecessary. Accordingly, the configuration of the second circulation circuit 620 can be simplified. Since the second heat transfer medium whose usable temperature range is narrower than that of the third heat transfer medium is used, an inexpensive heat transfer medium can be used as the second heat transfer medium.

Seventh Embodiment

A seventh embodiment will now be described. In the following description, the difference between the seventh embodiment and the first embodiment will be mainly described. Notably, portions identical with those of the first through sixth embodiments are denoted by the same reference numerals, and their description will not be repeated.

Figure 10:
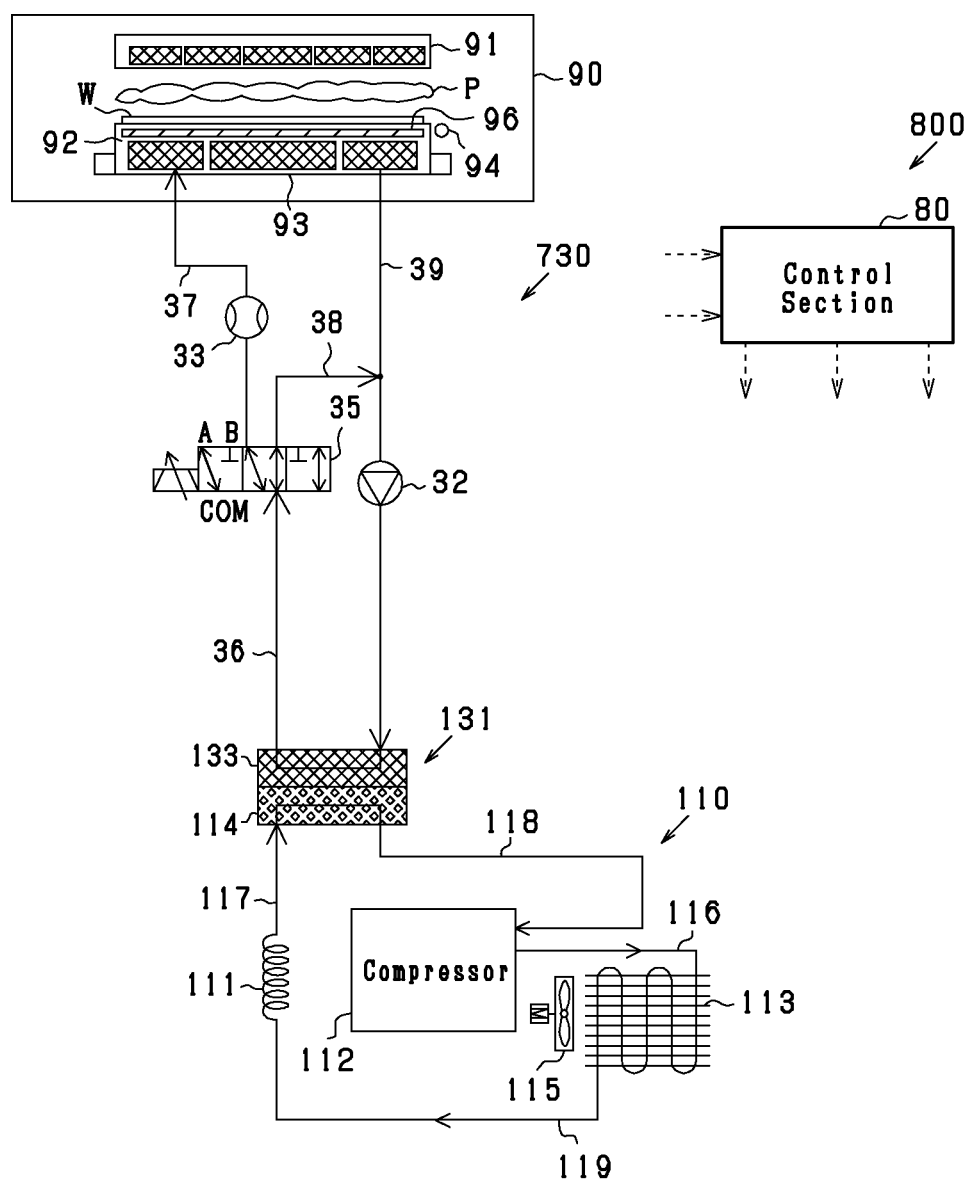
FIG. 10 is a schematic diagram of a temperature control system according to a seventh embodiment.

As shown in FIG. 10, a temperature control system 800 of the seventh embodiment of the present invention includes a heater 96 for directly heating the lower electrode 92, instead of the second circulation circuit 120 of the temperature control system 200 of the first embodiment.

The first circulation circuit 110 is a circuit through which the above-described first heat transfer medium circulates. A third circulation circuit 730 is a circuit which is independent of the first circulation circuit 110 and through which the above-described third heat transfer medium circulates.

The heater 96 is a heater which can control the amount of heat generated. The heater 96 includes a heating wire heater, a ceramic heater, or the like and is integrated with the lower electrode 92. The heating state of the heater 96 is controlled by the control section 80 (adjustment section).

A fifth distribution valve 35 (adjustment section) is a three-way valve having a common port, an A port, and a B port. The third flow-through section 133 and the common port of the fifth distribution valve 35 are connected to each other by a flow passage 36. The A port of the fifth distribution valve 35 and the inlet port of the heat exchanger 93 are connected to each other by a flow passage 37. A flowmeter 33 is provided in the flow passage 37. The flowmeter 33 measures the flow rate of the third heat transfer medium flowing through the flow passage 37.

The outlet port of the heat exchanger 93 and the third flow-through section 133 are connected to each other by a flow passage 39. The B port of the fifth distribution valve 35 and the flow passage 39 are connected to each other by a flow passage 38. The pump 32 is provided in the flow passage 39. In the flow passage 39, the pump 32 sucks the third heat transfer medium from the heat exchanger 93 side and discharges the third heat transfer medium toward the third flow-through section 133.

The fifth distribution valve 35 continuously changes the ratio between the flow rate of the third heat transfer medium flowing from the flow passage 36 to the flow passage 37 and the flow rate of the third heat transfer medium flowing from the flow passage 36 to the flow passage 38. Namely, the fifth distribution valve 35 changes the ratio between the third heat transfer medium flowing from the third flow-through section 133 to the heat exchanger 93 and the third heat transfer medium caused to return to the third flow-through section 133 without flowing from the third flow-through section 133 to the heat exchanger 93 (i.e., flowing through the heat exchanger 93). The fifth distribution valve 35 continuously changes the state of flow between a state in which all (100%) of the third heat transfer medium flows from the third flow-through section 133 to the heat exchanger 93 and a state in which all (100%) of the third heat transfer medium returns to the third flow-through section 133 without flowing from the third flow-through section 133 to the heat exchanger 93 (i.e., flowing through the heat exchanger 93). In the fifth distribution valve 35, the pressure loss of the third heat transfer medium is constant irrespective of the ratio at which the third heat transfer medium supplied from the third flow-through section 133 is distributed to the heat exchanger 93.

Since the load of the pump 32 does not change irrespective of the distribution ratio of the fifth distribution valve 35, the pump 32 is driven in a constant drive state. As a result, the pump 32 circulates the third heat transfer medium through the third circulation circuit 730. The third circulation circuit 730 does not include a tank for storing the third heat transfer medium. Notably, the flow passages 36 and 37 form a third supply path, and the flow passage 39 forms a third return path.

The seventh embodiment of the present invention having been described in detail above has the following advantages. Notably, only the advantages different from those of the first embodiment will be described.

The heater 96 can heat the lower electrode 92 and can control the amount of heat generated. Therefore, the lower electrode 92 can be heated directly without use of a heat transfer medium, whereby the configuration can be simplified.

The temperature control system 800 includes the fifth distribution valve 35 which adjusts the amount of heat exchanged between the first flow-through section 114 and the third flow-through section 133. Therefore, the thermal energy supplied to the third flow-through section 133 can be adjusted by the fifth distribution valve 35. Also, the temperature control system 800 includes the control section 80 which adjusts the heat generation amount of the heater 96. Therefore, the thermal energy supplied from the heater 96 directly to the lower electrode 92 can be adjusted by the control section 80. Accordingly, the temperature of the lower electrode 92 can be controlled. As described above, the amount of the third heat transfer medium circulating through the third circulation circuit 730 can be reduced. Accordingly, the temperature of the third heat transfer medium can be changed quickly, whereby responsiveness in controlling the temperature of the lower electrode 92 can be enhanced.

Eighth Embodiment

An eighth embodiment will now be described. In the following description, the difference between the eighth seventh embodiment and the fifth embodiment will be mainly described. Notably, portions identical with those of the first through seventh embodiments are denoted by the same reference numerals, and their description will not be repeated.

Figure 11:
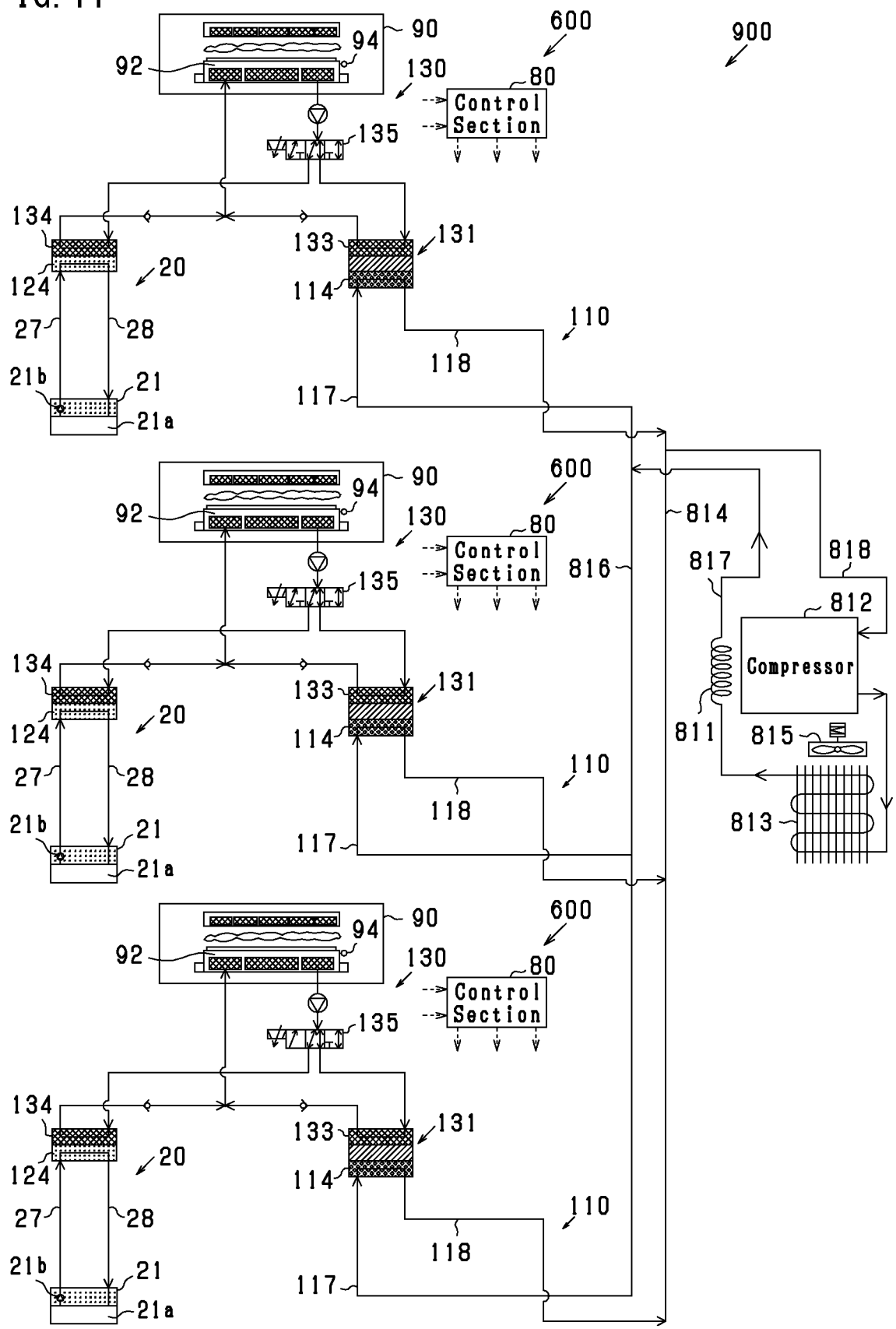
FIG. 11 is a schematic diagram of an integrated temperature control system according to an eighth embodiment.

As shown in FIG. 11, an integrated temperature control system 900 of the eighth embodiment of the present invention includes three (a plurality of) temperature control systems each of which is identical with the temperature control system 600 of the fifth embodiment. However, the integrated temperature control system 900 includes a single set of a first expansion section 811, a first compressor 812, a first condenser 813, and a first fan 815, which are large in size, instead of three sets of the first expansion sections 111, the first compressors 112, the first condensers 113, and the first fans 115.

The single set of the first expansion section 811, the first compressor 812, the first condenser 813, and the first fan 815 has a cooling capacity 10 to 100 times the cooling capacity of a single set of the first expansion section 111, the first compressor 112, the first condenser 113, and the first fan 115. The first expansion section 811 discharges the atomized first heat transfer medium to a common flow passage 816 through a flow passage 817 (first supply path). The common flow passage 816 (first supply path) is branched to three (a plurality of) flow passages each corresponding to the above-described flow passage 117. Each flow passage 117 is connected to the first flow-through section 114 of the corresponding temperature control system 600.

The flow passage 118 of each temperature control system 600 is connected to a common flow passage 814 (first return path). The common flow passage 814 is connected to the first compressor 812 by a flow passage 818 (first return path).

The eighth embodiment of the present invention having been described in detail above has the following advantages. Notably, only the advantages different from those of the fifth embodiment will be described.

A single set including the first expansion section 811 for supplying the atomized first heat transfer medium of the first temperature, the first compressor 812, and the first condenser 813 can be shared by the plurality of temperature control systems 600. Therefore, the configuration of the integrated temperature control system 900 including the plurality of temperature control systems 600 can be simplified. Notably, the number of the temperature control systems 600 provided in the integrated temperature control system 900 may be several tens to several hundred in some cases. In such a case, the above-described effect becomes remarkable.

Each temperature control system 600 controls the temperature of the lower electrode 92 by adjusting the amount of heat exchanged between the first flow-through section 114 and the third flow-through section 133 by using the third distribution valve 135. Therefore, the first expansion section 811 is required only to supply the atomized first heat transfer medium of the first temperature (constant temperature), and is not required to change the temperature of the first heat transfer medium in accordance with a change in the target temperature of the lower electrode 92. Accordingly, even in the case of a configuration in which the single set of the first expansion section 811, the first compressor 812, and the first condenser 813 is provided for the plurality of temperature control systems 600, the temperature of the lower electrode 92 of each temperature control system 600 can be controlled.

Notably, in place of three (a plurality of) control sections 80, a single integrated control section may be provided. In such a case, the integrated control section can control the drive state of the first compressor 812 in accordance with the set temperature of each temperature control system 600 and the temperature detected by the temperature sensor 94.

Also, a tank for storing the first heat transfer medium may be provided between the first condenser 813 and the first expansion section 811. As in the case of the first circulation circuit 110 of FIG. 2, free cooling may be performed by bypassing the first compressor 812.

Also, the above-described embodiments may be modified as follows. Portions identical with those of the above-described embodiments are denoted by the same reference numerals, and their description will not be repeated.

The second heat storage material 26a of the second heat storage unit 26 may change its state between solid and liquid at 80° C. (fourth temperature) which is lower than 90° C. (second temperature). In such a case, the control section 80 controls the second distribution valve 22 such that the second heat transfer medium having a temperature higher than 80° C. flows to the second heat storage unit 26. As a result, the second heat storage material 26a changes its state to liquid at 80° C., whereby latent heat (thermal energy) can be stored in the second heat storage unit 26. In the case where the second heat transfer medium (third heat transfer medium) whose temperature is lower than 80° C. flows through the second heat radiation flow-through section 26c, the thermal energy stored in the second heat storage material 26a can be used for heating of the second heat transfer medium (third heat transfer medium).

The control target is not limited to the lower electrode 92 and may be the upper electrode 91 of the semiconductor manufacturing apparatus 90. Also, the above-described temperature control systems can be applied not only to the semiconductor manufacturing apparatus 90 but also to other manufacturing apparatuses, processing apparatuses, etc.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A temperature control system for controlling a temperature of a control target of a semiconductor manufacturing apparatus using heat transfer media, the system comprising:
    a first circulation circuit through which only a first heat transfer medium circulates among the heat transfer media, the first heat transfer medium having a first temperature;
    a second circulation circuit through which only a second heat transfer medium circulates among the heat transfer media, the second heat transfer medium having a second temperature higher than the first temperature;
    a third circulation circuit through which only a third heat transfer medium circulates among the heat transfer media, the third heat transfer medium having a usable temperature range wider than usable temperature ranges of the first heat transfer medium and the second heat transfer medium; and
    first and second heat exchangers,
    wherein the first circulation circuit comprises:
        a first expansion section that expands the first heat transfer medium in a liquid state and atomizes the first heat transfer medium;
        a first flow-through section of the first heat exchanger that functions as an evaporator and through which the first heat transfer medium flows;
        a first supply path through which the first heat transfer medium, atomized by the first expansion section, flows to the first flow-through section;
        a first compressor that compresses the first heat transfer medium, having flowed from the first flow-through section, in a gas state;
        a first return path through which the first heat transfer medium, having flowed through the first flow-through section and evaporated, flows to the first compressor; and
        a first condenser that condenses the first heat transfer medium in the gas state compressed by the first compressor and supplies the condensed first heat transfer medium back to the first expansion section,
    wherein the second circulation circuit comprises:
        a second circuit evaporator that heats the second heat transfer medium to have the second temperature;
        a second flow-through section of the second heat exchanger through which the second heat transfer medium flows;
        a second supply path through which the second heat transfer medium supplied from the second circuit evaporator flows to the second flow-through section; and
        a second return path through which the second heat transfer medium, having flowed through the second flow-through section, flows back to the second circuit evaporator,
    wherein the third circulation circuit comprises:
        a third flow-through section of the first heat exchanger through which the third heat transfer medium flows and that exchanges heat with the first flow-through section;
        a fourth flow-through section of the second heat exchanger through which the third heat transfer medium flows and that exchanges heat with the second flow-through section;
        a third supply path through which the third heat transfer medium flows from the third flow-through section and the fourth flow-through section to a heat exchanger of the semiconductor manufacturing apparatus that exchanges heat with the control target; and
        a third return path through which the third heat transfer medium flows from the heat exchanger of the semiconductor manufacturing apparatus back to the third flow-through section and the fourth flow-through section,
    wherein the third circulation circuit does not comprise a tank that stores the third heat transfer medium, and
    wherein the temperature control system further comprises a distribution valve that adjusts:
        an amount of the heat exchanged between the first flow-through section and the third flow-through section, and
        an amount of the heat exchanged between the second flow-through section and the fourth flow-through section.

2. The temperature control system according to claim 1, further comprising:
    a controller that controls a drive state of the first compressor.

3. The temperature control system according to claim 2, wherein the first circulation circuit further comprises:
    a bypass flow passage that allows the evaporated first heat transfer medium to flow from the first return path to the first condenser while bypassing the first compressor; and
    an on-off valve that opens and closes the bypass flow passage, and
    wherein once the on-off valve opens, the controller stops the first compressor.

4. The temperature control system according to claim 1, wherein the first circulation circuit further comprises:
    a connection flow passage that establishes communication between the first supply path and a flow passage between the first compressor and the first condenser, wherein the first heat transfer medium in the gas state compressed by the first compressor flows to the first supply path through the connection flow passage; and
    an on-off valve that opens and closes the connection flow passage.

5. The temperature control system according to claim 1, wherein the second circulation circuit further comprises:
    a second expansion section that expands the second heat transfer medium in a liquid state, atomizes the second heat transfer medium, and supplies the atomized second heat transfer medium to the second supply path;
    a second compressor to which the second heat transfer medium, having flowed through the second flow-through section and evaporated, is supplied through the second return path and that compresses the second heat transfer medium in a gas state; and
    a second condenser that condenses the second heat transfer medium in the gas state compressed by the second compressor and supplies the condensed second heat transfer medium to the second expansion section.

6. The temperature control system according to claim 1, wherein
the second circulation circuit further comprises:
a second compressor that compresses the second heat transfer medium in a gas state and supplies the compressed second heat transfer medium to the second supply path; and
a second expansion section to which the second heat transfer medium, having flowed through the second flow-through section functioning as a condenser and become liquid, is supplied through the second return path and that expands the second heat transfer medium in a liquid state to atomize the second heat transfer medium, wherein
the second circuit evaporator evaporates the second heat transfer medium atomized by the second expansion section and supplies the evaporated second heat transfer medium to the second compressor.

7. The temperature control system according to claim 6, wherein the first condenser condenses the first heat transfer medium through heat exchange between the first heat transfer medium and cooling water having a first water temperature, and
wherein the second circuit evaporator evaporates the second heat transfer medium through heat exchange between the second heat transfer medium and cooling water having a second water temperature higher than the first water temperature.

8. The temperature control system according to claim 7, wherein the cooling water having the second water temperature is obtained from the cooling water having the first water temperature by being heated when used for cooling a predetermined member.

9. The temperature control system according to claim 6, wherein the first condenser condenses the first heat transfer medium through heat exchange between cooling water and the first heat transfer medium,
wherein the second circuit evaporator evaporates the second heat transfer medium through heat exchange between cooling water and the second heat transfer medium, and
wherein the temperature control system further comprises:
a pre-cooler that cools the cooling water supplied to the first condenser by using the cooling water that has flowed through the second circuit evaporator; and
a pre-heater that heats the cooling water supplied to the second circuit evaporator by using the cooling water that has flowed through the first condenser.

10. The temperature control system according to claim 1, wherein the second circulation circuit comprises a heater that can control a heat generation amount.

11. The temperature control system according to claim 1, wherein the first circulation circuit further comprises:
a first heat storage through which the first heat transfer medium flows and that stores thermal energy as a result of a state change of a first heat storage material at a third temperature,
wherein the first heat transfer medium atomized by the first expansion section flows to the first flow-through section and the first heat storage through the first supply path,
wherein the first heat transfer medium, having flowed through the first flow-through section and the first heat storage and evaporated, flows to the first compressor through the first return path,
wherein the second circulation circuit further comprises:
a second heat storage through which the second heat transfer medium flows and that stores thermal energy as a result of a state change of a second heat storage material at a fourth temperature higher than the third temperature,
wherein the second heat transfer medium supplied from the second circuit evaporator flows to the second flow-through section and the second heat storage through the second supply path, and
wherein the second heat transfer medium, having flowed through the second flow-through section and the second heat storage, flows to the second circuit evaporator through the second return path.

12. The temperature control system according to claim 11, wherein the distribution valve includes:
a first distribution valve that is disposed in the first supply path and changes a ratio at which the first heat transfer medium atomized by the first expansion section is distributed between the first flow-through section and the first heat storage; and
a second distribution valve that is disposed in the second supply path and changes a ratio at which the second heat transfer medium supplied from the second circuit evaporator is distributed between the second flow-through section and the second heat storage.

13. The temperature control system according to claim 12, further comprising:
a controller that controls the first distribution valve and the second distribution valve,
wherein when the controller controls the first distribution valve to allow the first heat transfer medium atomized by the first expansion section to flow to the first flow-through section, the controller controls the second distribution valve to allow the second heat transfer medium supplied from the second circuit evaporator to flow to the second heat storage, and
wherein when the controller controls the second distribution valve to allow the second heat transfer medium supplied from the second circuit evaporator to flow to the second flow-through section, the controller controls the first distribution valve to allow the first heat transfer medium atomized by the first expansion section to flow to the first heat storage.

14. The temperature control system according to claim 1, wherein the distribution valve includes:
a third distribution valve that is disposed in the third return path and changes a ratio between the third heat transfer medium flowing from the heat exchanger of the semiconductor manufacturing apparatus to the third flow-through section and the third heat transfer medium flowing from the heat exchanger of the semiconductor manufacturing apparatus to the fourth flow-through section.

15. The temperature control system according to claim 12, wherein the distribution valve further includes:
a third distribution valve that is disposed in the third return path and changes a ratio between the third heat transfer medium flowing from the heat exchanger of the semiconductor manufacturing apparatus to the third flow-through section and the third heat transfer medium flowing from the heat exchanger of the semiconductor manufacturing apparatus to the fourth flow-through section,
wherein the temperature control system further comprises:

a controller that controls the first distribution valve, the second distribution valve, and the third distribution valve, wherein when the controller controls the third distribution valve to prevent the third heat transfer medium from flowing from the heat exchanger of the semiconductor manufacturing apparatus to the third flow-through section, the controller controls the first distribution valve to allow the first heat transfer medium atomized by the first expansion section to flow to the first heat storage, and wherein when the controller controls the third distribution valve to prevent the third heat transfer medium from flowing from the heat exchanger of the semiconductor manufacturing apparatus to the fourth flow-through section, the controller controls the second distribution valve to allow the second heat transfer medium supplied from the second circuit evaporator to flow to the second heat storage.

16. The temperature control system according to claim 15, wherein the third return path comprises:
a first intermediary return path through which the third heat transfer medium flows from the heat exchanger of the semiconductor manufacturing apparatus to the third flow-through section through the first heat storage; and
a second intermediary return path through which the third heat transfer medium flows from the heat exchanger of the semiconductor manufacturing apparatus to the fourth flow-through section through the second heat storage.

17. The temperature control system according to claim 1, wherein the distribution valve includes:
a fourth distribution valve that is disposed in the third return path and changes a ratio among:
the third heat transfer medium flowing from the heat exchanger of the semiconductor manufacturing apparatus to the third flow-through section,
the third heat transfer medium flowing out of the heat exchanger of the semiconductor manufacturing apparatus and returning to the heat exchanger without flowing through the third flow-through section and the fourth flow-through section, and
the third heat transfer medium flowing from the heat exchanger of the semiconductor manufacturing apparatus to the fourth flow-through section.

18. A temperature control system for controlling the temperature of a control target of a semiconductor manufacturing apparatus using heat transfer media, the system comprising:
a first circulation circuit through which only a first heat transfer medium circulates among the heat transfer media;
a heater that heats the control target and can control a heat generation amount;
a third circulation circuit through which only a third heat transfer medium circulates among the heat transfer media, the third heat transfer medium having a usable temperature range wider than a usable temperature range of the first heat transfer medium; and
a first heat exchanger,
wherein the first circulation circuit comprises:
a first expansion section that expands the first heat transfer medium in a liquid state and atomizes the first heat transfer medium;
a first flow-through section of the first heat exchanger that functions as an evaporator and through which the first heat transfer medium flows;
a first supply path through which the first heat transfer medium, atomized by the first expansion section and having a first temperature, flows to the first flow-through section;
a first compressor that compresses the first heat transfer medium, having flowed from the first flow-through section, in a gas state;
a first return path through which the first heat transfer medium, having flowed through the first flow-through section and evaporated, flows to the first compressor; and
a first condenser that condenses the first heat transfer medium in the gas state compressed by the first compressor and supplies the condensed first heat transfer medium back to the first expansion section,
wherein the third circulation circuit comprises:
a third flow-through section of the first heat exchanger through which the third heat transfer medium flows and that exchanges heat with the first flow-through section;
a third supply path through which the third heat transfer medium flows from the third flow-through section to a heat exchanger of the semiconductor manufacturing apparatus that exchanges heat with the control target; and
a third return path through which the third heat transfer medium flows from the heat exchanger of the semiconductor manufacturing apparatus back to the third flow-through section,
wherein the third circulation circuit does not comprise a tank that stores the third heat transfer medium, and
wherein the temperature control system further comprises a distribution valve that adjusts:
an amount of the heat exchanged between the first flow-through section and the third flow-through section, and
the heat generation amount of the heater.

19. An integrated temperature control system comprising:
a plurality of temperature control systems each of which controls a temperature of a control target of a semiconductor manufacturing apparatus using heat transfer media and comprises:
a first circulation circuit through which only a first heat transfer medium circulates among the heat transfer media, the first heat transfer medium having a first temperature;
a second circulation circuit through which only a second heat transfer medium circulates among the heat transfer media, the second heat transfer medium having a second temperature higher than the first temperature;
a third circulation circuit through which only a third heat transfer medium circulates among the heat transfer media, the third heat transfer medium having a usable temperature range wider than usable temperature ranges of the first heat transfer medium and the second heat transfer medium; and
first and second heat exchangers,
wherein the first circulation circuit comprises:
a first expansion section that expands the first heat transfer medium in a liquid state and atomizes the first heat transfer medium;
a first flow-through section of the first heat exchanger that functions as an evaporator and through which the first heat transfer medium flows;

a first supply path through which the first heat transfer medium, atomized by the first expansion section, flows to the first flow-through section;

a first compressor that compresses the first heat transfer medium, having flowed from the first flow-through section, in a gas state;

a first return path through which the first heat transfer medium, having flowed through the first flow-through section and evaporated, flows to the first compressor; and a first condenser that condenses the first heat transfer medium in the gas state compressed by the first compressor and supplies the condensed first heat transfer medium back to the first expansion section, wherein the second circulation circuit comprises:

a second circuit evaporator that heats the second heat transfer medium to have the second temperature;

a second flow-through section of the second heat exchanger through which the second heat transfer medium flows;

a second supply path through which the second heat transfer medium supplied from the second circuit evaporator flows to the second flow-through section; and a second return path through which the second heat transfer medium, having flowed through the second flow-through section, flows back to the second circuit evaporator, wherein the third circulation circuit comprises:

a third flow-through section of the first heat exchanger through which the third heat transfer medium flows and that exchanges heat with the first flow-through section;

a fourth flow-through section of the second heat exchanger through which the third heat transfer medium flows and that exchanges heat with the second flow-through section;

a third supply path through which the third heat transfer medium flows from the third flow-through section and the fourth flow-through section to a heat exchanger of the semiconductor manufacturing apparatus that exchanges heat with the control target; and a third return path through which the third heat transfer medium flows from the heat exchanger of the semiconductor manufacturing apparatus back to the third flow-through section and the fourth flow-through section, wherein the third circulation circuit does not comprise a tank that stores the third heat transfer medium, wherein each of the temperature control systems further comprises a distribution valve that adjusts:

an amount of the heat exchanged between the first flow-through section and the third flow-through section, and an amount of the heat exchanged between the second flow-through section and the fourth flow-through section, and wherein the temperature control systems comprise a single set comprising the first expansion section, the first compressor, and the first condenser.

* * * * *